US010424735B2

United States Patent
Lee et al.

(10) Patent No.: US 10,424,735 B2
(45) Date of Patent: Sep. 24, 2019

(54) ORGANIC LIGHT-EMITTING DISPLAY APPARATUS, ORGANIC LAYER DEPOSITION APPARATUS, AND METHOD OF MANUFACTURING THE ORGANIC LIGHT-EMITTING DISPLAY APPARATUS BY USING THE ORGANIC LAYER DEPOSITION APPARATUS

(71) Applicant: SAMSUNG DISPLAY CO., LTD., Yongin-si, Gyeonggi-do (KR)

(72) Inventors: Suhwan Lee, Yongin-si (KR); Muhyun Kim, Yongin-si (KR); Dongkyu Lee, Yongin-si (KR); Eunho Kim, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 141 days.

(21) Appl. No.: 15/059,323

(22) Filed: Mar. 3, 2016

(65) Prior Publication Data
US 2017/0040537 A1  Feb. 9, 2017

(30) Foreign Application Priority Data
Aug. 4, 2015  (KR) .................. 10-2015-0110235

(51) Int. Cl.
*H01L 51/00* (2006.01)
*C23C 14/04* (2006.01)
(Continued)

(52) U.S. Cl.
CPC ........ *H01L 51/0011* (2013.01); *C23C 14/042* (2013.01); *C23C 14/568* (2013.01);
(Continued)

(58) Field of Classification Search
CPC .... C23C 16/24; C23C 14/042; H01L 51/0011
(Continued)

(56) References Cited

U.S. PATENT DOCUMENTS 7,265,384 B2  9/2007  Oh
9,257,649 B2  2/2016  Han
(Continued)

FOREIGN PATENT DOCUMENTS

CN  1691356 A  11/2005
CN  103515543 A  1/2014
(Continued)

OTHER PUBLICATIONS

Chinese Office Action dated Jul. 11, 2019.

*Primary Examiner* — Alex A Rolland
(74) *Attorney, Agent, or Firm* — Lee & Morse, P.C.

(57) ABSTRACT

An organic layer deposition apparatus, including a deposition unit including at least one deposition assembly spaced apart from a substrate, the at least one deposition assembly depositing a material on the substrate, the at least one deposition assembly including a deposition source that discharges a deposition material; a deposition source nozzle unit mounted on the deposition source, the deposition source nozzle unit having a deposition source nozzle formed therein; and a plurality of pattern sheets facing the deposition source nozzle unit and spaced apart from one another so that the deposition material is deposited on a plurality of different regions of the substrate via the plurality of pattern sheets.

11 Claims, 14 Drawing Sheets

(51) Int. Cl.
*H01L 21/67* (2006.01)
*C23C 14/56* (2006.01)
*H01L 21/677* (2006.01)
*H01L 27/32* (2006.01)
*H01L 51/56* (2006.01)

(52) U.S. Cl.
CPC .... *H01L 21/6776* (2013.01); *H01L 21/67173* (2013.01); *H01L 27/3244* (2013.01); *H01L 51/56* (2013.01)

(58) Field of Classification Search
USPC .......................................................... 118/726
See application file for complete search history.

(56) References Cited

U.S. PATENT DOCUMENTS

| | | |
|---|---|---|
| 9,260,778 B2 | 2/2016 | Chang et al. |
| 9,496,524 B2 | 11/2016 | Lee et al. |
| 2003/0232563 A1 | 12/2003 | Kamiyama et al. |
| 2007/0178708 A1 | 8/2007 | Ukigaya |
| 2009/0181163 A1 | 7/2009 | Uetake |
| 2009/0220691 A1 | 9/2009 | Kim |
| 2010/0297348 A1 | 11/2010 | Lee et al. |
| 2010/0297349 A1 | 11/2010 | Lee et al. |
| 2012/0299016 A1* | 11/2012 | Choi ............... C23C 14/042 257/79 |
| 2014/0014917 A1* | 1/2014 | Lee ............... H01L 51/56 257/40 |
| 2014/0014921 A1 | 1/2014 | Choi |
| 2015/0159267 A1* | 6/2015 | Ochi ............... C23C 14/042 118/721 |

FOREIGN PATENT DOCUMENTS

| | | |
|---|---|---|
| CN | 103540896 A | 1/2014 |
| CN | 103545460 A | 1/2014 |
| CN | 103545462 A | 1/2014 |
| JP | 2003-157973 A | 5/2003 |
| KR | 10-2009-0093161 A | 9/2009 |
| KR | 10-2010-0133679 A | 12/2010 |
| KR | 10-2011-0082418 A | 7/2011 |
| KR | 10-2012-0131548 A | 12/2012 |
| KR | 10-2016-0005850 A | 1/2016 |

* cited by examiner

ORGANIC LIGHT-EMITTING DISPLAY APPARATUS, ORGANIC LAYER DEPOSITION APPARATUS, AND METHOD OF MANUFACTURING THE ORGANIC LIGHT-EMITTING DISPLAY APPARATUS BY USING THE ORGANIC LAYER DEPOSITION APPARATUS

CROSS-REFERENCE TO RELATED APPLICATION

Korean Patent Application No. 10-2015-0110235, filed on Aug. 4, 2015, in the Korean Intellectual Property Office, and entitled: "Organic Light-Emitting Display Apparatus, Organic Layer Deposition Apparatus, and Method of Manufacturing the Organic Light-Emitting Display Apparatus by Using the Organic Layer Deposition Apparatus," is incorporated by reference herein in its entirety.

BACKGROUND

1. Field

One or more exemplary embodiments relate to an organic light-emitting display apparatus, an organic layer deposition apparatus, and a method of manufacturing the organic light-emitting display apparatus by using the organic layer deposition apparatus.

2. Description of the Related Art

Organic light-emitting display apparatuses may have a larger viewing angle, better contrast characteristics, and a faster response speed than other display apparatuses, and may be a next-generation display apparatus.

SUMMARY

Embodiments may be realized by providing an organic layer deposition apparatus, including a deposition unit including at least one deposition assembly spaced apart from a substrate, the at least one deposition assembly depositing a material on the substrate, the at least one deposition assembly including a deposition source that discharges a deposition material; a deposition source nozzle unit mounted on the deposition source, the deposition source nozzle unit having a deposition source nozzle formed therein; and a plurality of pattern sheets facing the deposition source nozzle unit and spaced apart from one another so that the deposition material is deposited on a plurality of different regions of the substrate via the plurality of pattern sheets.

Two of the plurality of different regions of the substrate may be parallel to each other.

The plurality of pattern sheets may be within a single space.

The deposition source may be between adjacent pattern sheets from among the plurality of pattern sheets.

The at least one deposition assembly may include a plurality of the deposition sources, and each of the plurality of deposition sources may correspond to each of the plurality of pattern sheets.

The plurality of deposition sources may be within different spaces, respectively.

The at least one deposition assembly may further include a frame in which the plurality of pattern sheets is mounted.

The at least one deposition assembly may further include a plurality of frames, each of the pattern sheets being respectively mounted in one of the frames.

Adjacent frames from among the plurality of frames may at least partially overlap each other.

The plurality of pattern sheets may be arranged on a same plane.

Adjacent pattern sheets from among the plurality of pattern sheets may zigzag with respect to a straight line that passes between the adjacent pattern sheets and is parallel to a deposition-proceeding direction.

Each of the plurality of pattern sheets may be eccentric with respect to a straight line that passes between adjacent pattern sheets and is parallel to a deposition-proceeding direction.

The organic layer deposition apparatus may further include a first shielding member adjacent to each of the plurality of pattern sheets.

The plurality of pattern sheets may be arranged in a diagonal direction with respect to a direction in which the substrate is transferred.

The at least one deposition assembly may further include a second shielding member, the second shielding member separating the plurality of pattern sheets from one another.

The second shielding member may be between adjacent pattern sheets from among the plurality of pattern sheets.

The at least one deposition assembly may form a pattern layer on the substrate.

The deposition unit may include a plurality of the deposition assemblies, and at least certain ones of the plurality of deposition assemblies may be within different spaces.

The deposition unit may include a plurality of the deposition assemblies, and the plurality of deposition assemblies may form different organic layers.

The organic layer deposition apparatus may further include a conveyer unit that includes a first conveyer unit and a second conveyer unit that cyclically move a moving unit to which the substrate has been detachably fixed. The first conveyer unit may convey, in a first direction, the moving unit, and the second conveyer unit may convey the moving unit separated from the substrate in a second direction opposite to the first direction.

The deposition unit may further include a chamber including the at least one deposition assembly therein and through which the moving unit passes.

The organic layer deposition apparatus may further include an unloading unit separating the substrate from the moving unit. The moving unit may circulate between the first conveyer unit and the second conveyer unit, and the substrate fixed to the moving unit may be spaced apart from the at least one deposition assembly while the substrate is being moved by the first conveyer unit.

The first conveyer unit may sequentially convey the moving unit to a loading unit, the deposition unit, and the unloading unit.

The second conveyer unit may sequentially convey the moving unit to the unloading unit, the deposition unit, and the loading unit.

The first conveyer unit and the second conveyer unit may pass through the deposition unit.

The first conveyer unit and the second conveyer unit may be on one another in a vertical direction.

The substrate and the at least one deposition assembly may be apart from each other and move relative to each other.

The deposition source nozzle unit may include a plurality of deposition source nozzles arranged in a first direction, and each of the plurality of pattern sheets may include a plurality of patterning slits in a second direction perpendicular to the first direction.

The deposition source, the deposition source nozzle unit, and at least one of the plurality of pattern sheets may be coupled to one another by a connection member and integrally formed with one another.

The connection member may guide a movement path of the deposition material.

The connection member may shield a space between the deposition source, the deposition source nozzle unit, and at least one of the plurality of pattern sheets from the outside.

Embodiments may be realized by providing an organic light-emitting display apparatus, including a substrate; at least one thin film transistor formed on the substrate, the at least one thin film transistor including a semiconductor active layer, a gate electrode insulated from the semiconductor active layer, and source and drain electrodes contacting the semiconductor active layer; a plurality of pixel electrodes formed on the at least one thin film transistor; a plurality of organic layers respectively formed on the plurality of pixel electrodes; and an opposite electrode formed on the plurality of organic layers, at least one of the plurality of organic layers on the substrate being formed using the presently disclosed organic layer deposition apparatus.

Embodiments may be realized by providing a method of manufacturing an organic light-emitting display apparatus by using an organic layer deposition apparatus for forming an organic layer on a substrate, the method including fixing the substrate to a moving unit, the fixing being performed by a loading unit; conveying the moving unit to which the substrate has been fixed into a chamber by using a first conveyer unit mounted to pass through the chamber; forming the organic layer by depositing a deposition material discharged from a deposition assembly within the chamber on different regions of the substrate via a plurality of pattern sheets apart from each other while the substrate is moving relative to the deposition assembly with the substrate separated from the deposition assembly; separating a deposition-completed substrate from the moving unit, the separating being performed by an unloading unit; and transferring the moving unit separated from the substrate to the loading unit by using a second conveyer unit mounted to pass through the chamber.

Two of the different regions of the substrate may be parallel to each other.

The organic layer may be a pattern layer.

The plurality of pattern sheets may zigzag with respect to a straight line parallel to a direction in which the deposition material is deposited.

The deposition assembly may include a deposition source which emits the deposition material to the outside, and the deposition source may be between adjacent pattern sheets from among the plurality of pattern sheets.

The deposition assembly may include a plurality of deposition sources which emit the deposition material to the outside, and each of the plurality of deposition sources may correspond to each of the plurality of pattern sheets.

The plurality of pattern sheets may be arranged on a same plane.

A portion of the deposition material may be blocked by a first shielding member adjacent to each of the plurality of pattern sheets.

The chamber may include a plurality of the deposition assemblies, and at least certain ones of the plurality of deposition assemblies may be within different spaces.

The chamber may include a plurality of the deposition assemblies, and the plurality of deposition assemblies may form different organic layers.

The organic layer may be formed with each of the plurality of pattern sheets separated from one another by a second shielding member.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
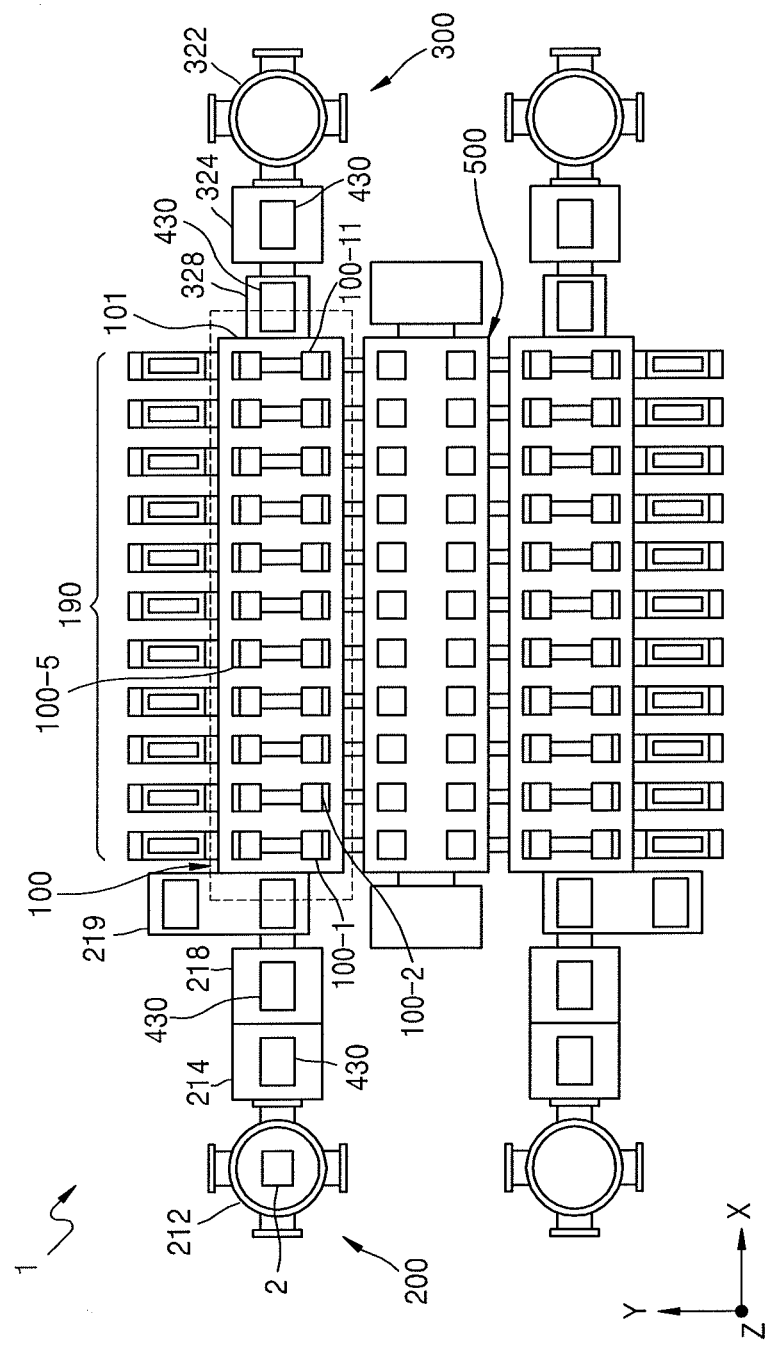
FIG. 1 illustrates a schematic plan view of an organic layer deposition apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Reference will now be made in detail to embodiments, examples of which are illustrated in the accompanying drawings, wherein like reference numerals refer to like elements throughout.

It will be understood that although the terms "the first", "the second", etc., may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
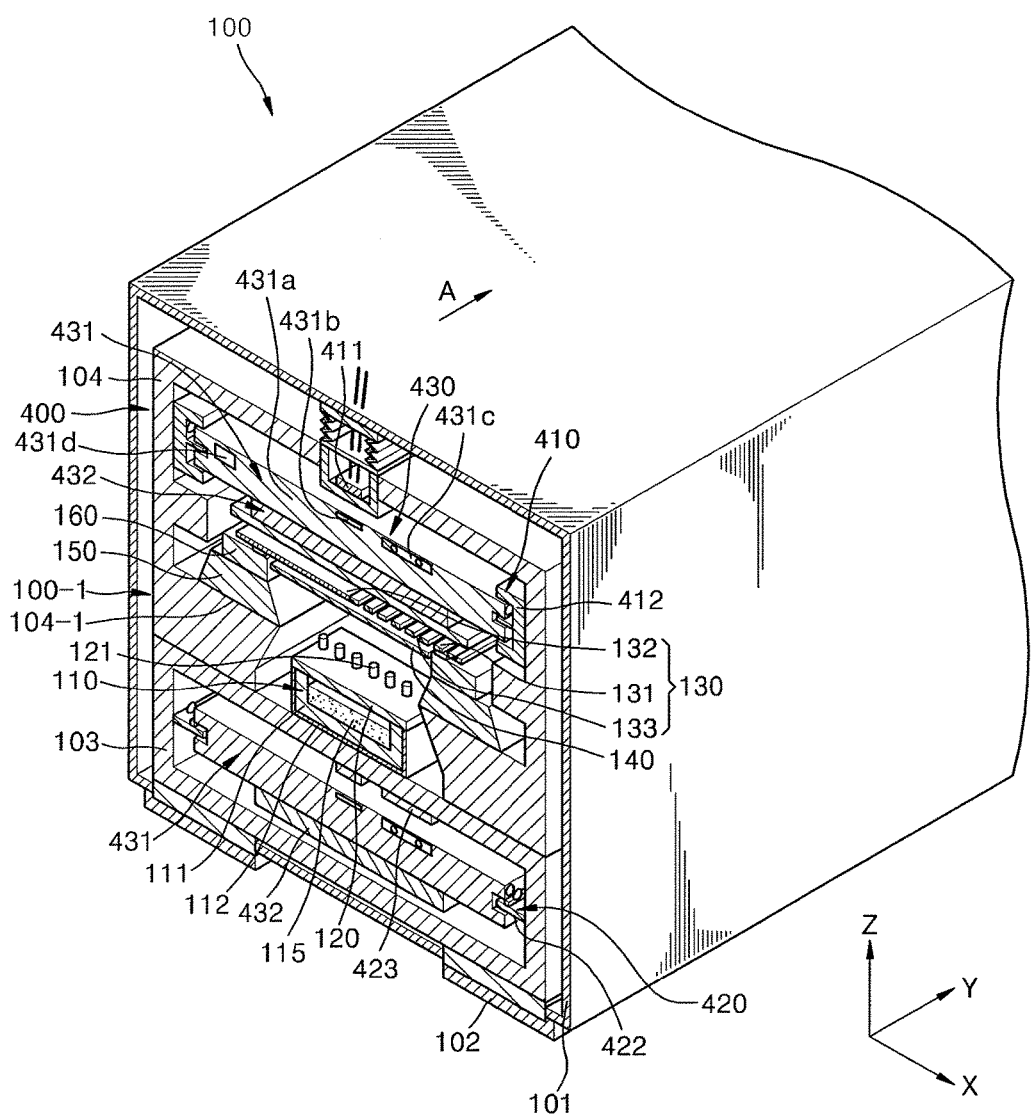
FIG. 2 illustrates a schematic perspective cross-sectional view of a part of a deposition unit included in the organic layer deposition apparatus shown in FIG. 1, according to an embodiment.
Figure 3:
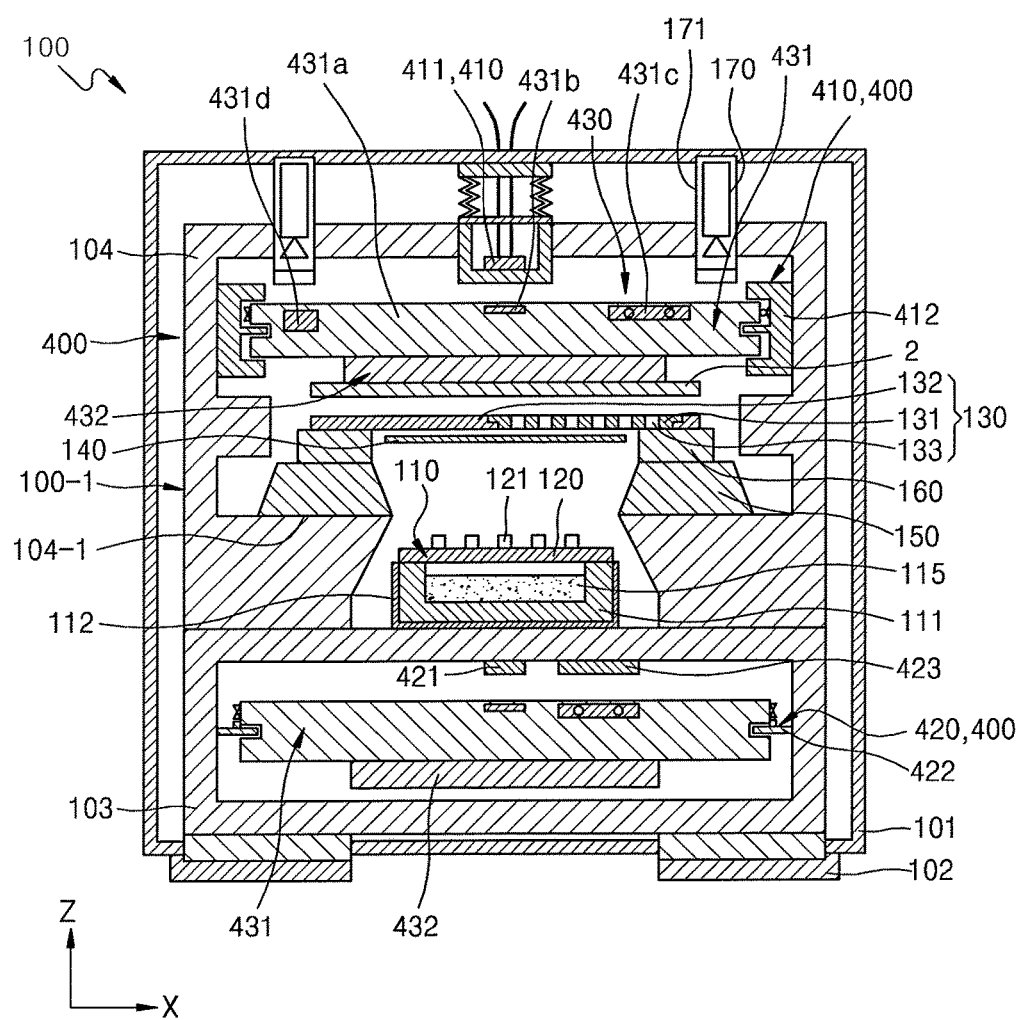
FIG. 3 illustrates a schematic cross-sectional view of a part of the deposition unit included in the organic layer deposition apparatus shown in FIG. 1, according to an embodiment.

FIG. 1 illustrates a schematic plan view of an organic layer deposition apparatus 1 according to an embodiment. FIG. 2 illustrates a schematic perspective cross-sectional view of a part of a deposition unit 100 of the organic layer deposition apparatus 1 of FIG. 1, according to an embodiment. FIG. 3 illustrates a schematic cross-sectional view of a part of the deposition unit 100 of the organic layer deposition apparatus 1 of FIG. 1, according to an embodiment.

Referring to FIGS. 1-3, the organic layer deposition apparatus 1 may include the deposition unit 100, a loading unit 200, an unloading unit 300, and a conveyer unit 400.

The loading unit 200 may include a first rack 212, an introduction chamber 214, a first inversion chamber 218, and a buffer chamber 219.

The first rack 212 may hold a plurality of substrates 2 to be processed in the deposition unit 100. The introduction chamber 214 may include a transport robot to pick up one of the substrates 2 from the first rack 212. The transport robot may dispose the substrate 2 on a moving unit 430. The moving unit 430, on which the substrate 2 may be disposed, may be transferred by the transport robot into the first inversion chamber 218.

The first inversion chamber 218 may be disposed adjacent to the introduction chamber 214. The first inversion chamber 218 may include a first inversion robot that may invert the moving unit 430 and then may load the moving unit 430 into a first conveyer unit 410 of the deposition unit 100.

Referring to FIG. 1, the transport robot of the introduction chamber 214 may place one of the substrates 2 on an upper surface of the moving unit 430, and the moving unit 430 may be transferred into the first inversion chamber 218. The first inversion robot of the first inversion chamber 218 may invert the first inversion chamber 218 so that the substrate 2 is turned upside down in the deposition unit 100.

The unloading unit 300 may be configured to operate in an opposite manner to the loading unit 200 described above. A second inversion robot of a second inversion chamber 328 may invert the substrate 2 on the moving unit 430 that has passed through the deposition unit 100, and then may move the moving unit 430 into an ejection chamber 324. Then, an ejection robot of the ejection chamber 324 may eject the substrate 2 and the moving unit 430 from the ejection chamber 324, may separate the substrate 2 from the moving unit 430, and then may load the substrate 2 into a second rack 322. The moving unit 430, separated from the substrate 2, may be returned to the loading unit 200 via the second conveyer unit 420.

In an embodiment, when disposing the substrate 2 on the moving unit 430, the substrate 2 may be fixed onto a lower surface of the moving unit 430 and then moved into the deposition unit 100. In an embodiment, the first inversion robot of the first inversion chamber 218 and the second inversion robot of the second inversion chamber 328 may be omitted.

The deposition unit 100 may include at least one chamber 101. For example, the deposition unit 100 may include a chamber 101 housing a plurality of deposition assemblies 100-1, 100-2, through to 100-n. According to the embodiment illustrated in FIG. 1, the chamber 101 may house first to eleventh deposition assemblies 100-1 to 100-11. The number of deposition assemblies is not limited to eleven (11) and may vary according to a deposition material and deposition conditions. The chamber 101 may be maintained in a vacuum state during a deposition process.

The moving unit 430, on which the substrate 2 may be placed, may be moved to at least the deposition unit 100 by the first conveyor unit 410, or may sequentially travel through the loading unit 200, the deposition unit 100, and the unloading unit 300 by using the first conveyor unit 410. The moving unit 430 may be separated from the substrate 2 in the unloading unit 300, and then may return from the unloading unit 300 to the loading unit 200 using the second conveyer unit 420.

The first conveyer unit 410 may be configured to pass through the chamber 101 when passing through the deposition unit 100, and the second conveyer unit 420 may be configured to convey the moving unit 430 from which the substrate 2 may be separated.

In the organic layer deposition apparatus 1, the first conveyer unit 410 may be disposed over the second conveyer unit 420, and after the moving unit 430, on which deposition has been completed while being transferred by the first conveyer unit 410, may be separated from the substrate 2 in the unloading unit 300, the moving unit 430 may be returned to the loading unit 200 via the second conveyer unit 420 below the first conveyer unit 410, and the organic layer deposition apparatus 1 may have improved space utilization efficiency.

The deposition unit 100 of FIG. 1 may further include a deposition source replacement unit 190 disposed at a side of each organic layer deposition assembly. The deposition source replacement unit 190 may be a cassette-type structure. The deposition source replacement unit 190 may be formed to be drawn out from each organic layer deposition assembly, and a deposition source 110 (refer to FIG. 3) of each organic layer deposition assembly may be easily replaced.

FIG. 1 illustrates two organic layer deposition apparatuses 1 arranged in parallel. The two organic layer deposition apparatuses 1 may be arranged side by side, and a patterning slit sheet replacement unit 500 may be disposed between the two organic layer deposition apparatuses 1. The two organic layer deposition apparatuses 1 may share the patterning slit sheet replacement unit 500, and space utilization efficiency may be improved.

The deposition unit 100 of the organic layer deposition apparatus 1 may include at least one deposition assembly, for example, the deposition assemblies 100-1 through 100-n, and the conveyer unit 400.

The deposition unit 100 will now be described in detail.

The chamber 101 may have a hollow box-type structure and may accommodate at least one, for example, the deposition assembly 100-1 and the conveyer unit 400. The chamber 101 may be fixed on the ground using a foot 102, the foot 102 may be attached to a lower housing 103, and the lower housing 103 may be coupled to an upper housing 104. For example, the upper housing 104 may be stacked on the lower housing 103. The chamber 101 may accommodate both the lower housing 103 and the upper housing 104. A connection part of the lower housing 103 and the chamber 101 may be sealed, and the inside of the chamber 101 may be completely isolated from the outside. Due to, for example, the structure in which the lower housing 103 and the upper housing 104 may be disposed on the foot 102 fixed on the ground, the lower housing 103 and the upper housing 104 may be maintained in a fixed position even though the chamber 101 repeatedly may contract and expand, and the lower housing 103 and the upper housing 104 may serve as a reference frame in the deposition unit 100.

The upper housing 104 may include the deposition assembly 100-1 and the first conveyer unit 410 of the conveyer unit 400, and the lower housing 103 may include the second conveyer unit 420 of the conveyer unit 400. While the moving unit 430 is passing through the deposition unit 100 by using the first conveyer unit 410 and the second conveyer unit 420, a deposition process may be continuously performed.

The plurality of deposition assemblies 100-1 through 100-n may be substantially the same as each other. A fifth deposition assembly 100-5 from among the plurality of deposition assemblies 100-1 through 100-n will now be described in detail. For example, a fifth deposition assembly 100-5 forming a pattern layer included in an organic layer will now be described in detail.

The fifth deposition assembly 100-5 may include, for example, a deposition source 110, a deposition source nozzle unit 120, a patterning slit sheet 130, a plurality of source shutters 140, a first stage 150, and a second stage 160. All the components of the deposition unit 100 illustrated in FIGS. 2 and 3 may be disposed within the chamber 101 that may be maintained at an appropriate degree of vacuum. The chamber 101 may be maintained at an appropriate vacuum to allow a deposition material 115 to move in a substantially straight line through the organic layer deposition apparatus 1.

The substrate 2, on which the deposition material 115 may be deposited, may be disposed in the chamber 101. The substrate 2 may be a substrate for organic light-emitting display apparatuses. The substrate 2 may be a large substrate having a size of 40 inches or greater and capable of manufacturing a plurality of organic light-emitting display apparatuses. Other substrates may also be employed. For example, the substrate 2 may include a plurality of cells C. Each cell C may form each layer and may then be cut, and may be turned into each organic light-emitting display apparatus.

In the deposition process, the substrate 2 may pass over the fifth deposition assembly 100-5.

For example, in a comparative fine metal mask (FMM) deposition method, the size of the FMM may have to be equal to the size of a substrate, and the size of the FMM may have to be increased as the substrate becomes larger. However, it may not be straightforward to manufacture a large FMM or to extend an FMM to be accurately aligned with a pattern.

In the fifth deposition assembly 100-5, the deposition process may be performed while the fifth deposition assembly 100-5 or the substrate 2 is moved relative to the other. The deposition process may be continuously performed while the substrate 2 facing the fifth deposition assembly 100-5 is moved in a Y-axis direction, and the deposition process may be performed in a scanning manner in a direction of arrow A of FIG. 2. In FIG. 2, the deposition process may be performed while the substrate 2 is moving in the Y-axis direction within the chamber 101. In an embodiment, the deposition process may be performed while the fifth deposition assembly 100-5 is moving in the Y-axis direction while the substrate 2 is held at a fixed position.

In the fifth deposition assembly 100-5, the patterning slit sheet 130 may be significantly smaller than an FMM used in a comparative deposition method. In the fifth deposition assembly 100-5, the deposition process may be continuously performed, i.e., in a scanning manner, while the substrate 2 is moving in the Y-axis direction, and the patterning slit sheet 130 may have a length in at least one of the X-axis and Y-axis directions that may be significantly less than the length of the substrate 2. In the scanning deposition method, the patterning slit sheet 130 may be significantly smaller than a comparative FMM, and the patterning slit sheet 130 may easily be manufactured. Using the patterning slit sheet 130, which may be smaller than the comparative FMM used in a comparative deposition method, may be more convenient in all processes, including etching and other subsequent processes, such as precise extension, welding, moving, and cleaning processes, compared to the comparative deposition method using the comparative FMM. This may be more advantageous for a relatively large organic light-emitting display apparatus.

In order to perform the deposition process while the organic layer deposition assembly 100-5 or the substrate 2 is moved relative to the other as described above, the fifth deposition assembly 100-5 and the substrate 2 may be separated from each other by a certain distance. This will be described later in detail.

In the deposition source 110, the deposition material 115 may be contained and heated. The deposition source 110 may be disposed within the chamber 101, facing the substrate 2. As the deposition material 115 contained within the deposition source 110 is vaporized, the deposition material 115 may be deposited on the substrate 2.

For example, the deposition source 110 may include a crucible 111 containing the deposition material 115, and a heater 112 heating the crucible 111 to vaporize the deposition material 115 contained in the crucible 111 toward one side of the crucible 111, for example, toward the deposition source nozzle unit 120.

The deposition source nozzle unit 120 may cover an open end of the crucible 111, facing the substrate 2. In the fifth deposition assembly 100-5, the deposition source nozzle unit 120 may be differently arranged to form a common layer and a pattern layer.

The patterning slit sheet 130 may be disposed between the deposition source 110 and the substrate 2. The patterning slit sheet 130 may include a pattern sheet 131 and a frame 132. The pattern sheet 131 may have a shape similar to a window frame. In the pattern sheet 131, a plurality of patterning slits 133 may be arranged in the X-axis direction. The patterning slit sheet 130 will now be described in more detail.

The deposition material 115 vaporized in the deposition source 110 may move towards the substrate 2, on which the deposition material 115 may be deposited, through the deposition source nozzle unit 120 and the patterning slit sheet 130. The patterning slit sheet 130 may be manufactured by an etching method, which may be the same method as used in a method of manufacturing a comparative FMM, for example, a striped FMM.

The patterning slit sheet 130 may be disposed above the deposition source 110 at a distance from the deposition source 110 and the deposition source nozzle unit 120 coupled with the deposition source 110.

As described above, the fifth deposition assembly 100-5 may perform deposition while being moved relative to the substrate 2. In order to move the fifth deposition assembly 100-5 relative to the substrate 2, the patterning slit sheet 130 may be separated from the substrate 2 by a certain distance.

For example, in a comparative deposition method using an FMM, deposition may be performed with the FMM in close contact with a substrate in order to prevent formation of a shadow zone on the substrate. However, when the FMM is used in close contact with the substrate, the contact may cause defects. In the comparative deposition method, the size of the mask may have to be the same as the size of the substrate since the mask may not be moved relative to the substrate, and the size of the mask may have to be increased as organic light-emitting display apparatuses become larger. However, it may not be easy to manufacture such a large mask.

In the fifth deposition assembly 100-5 according to the current embodiment, the patterning slit sheet 130 may be disposed to be separated from the substrate 2, on which the deposition material 115 may be deposited, by a certain distance.

As described above, according to embodiments, deposition may be performed while the patterning slit sheet 130 is moved relative to the substrate 2, and the patterning slit sheet 130 may be easily manufactured. Defects caused due to, for example, the contact between the substrate 2 and the patterning slit sheet 130, may be prevented. A manufacturing time may be reduced by eliminating a process step for contacting the substrate 2 with the patterning slit sheet 130.

Arrangement of each component of the upper housing 104 will now be described in detail.

First, the deposition source 110 and the deposition source nozzle unit 120 may be disposed in an opening of the bottom of the upper housing 104. The upper housing 104 may have accommodation portions 104-1 defining the opening. The first stage 150, the second stage 160, and the patterning slit sheet 130 may be sequentially formed on the accommodation portions 104-1 in this order.

The first stage 150 may be configured to be movable in the X-axis and Y-axis directions, and the first stage 150 may align the patterning slit sheet 130 on the substrate 2. The first stage 150 may include a plurality of actuators, and the first stage 150 may be moved in the X-axis and Y-axis directions within the upper housing 104.

The second stage 160 may be configured to be movable in the Z-axis direction, and the second stage 160 may adjust a distance between the patterning slit sheet 130 and the substrate 2 in the Z-axis direction. The second stage 160 may include a plurality of actuators, and the second stage 160 may be moved in the Z-axis direction within the upper housing 104.

The patterning slit sheet 130 may be disposed on the second stage 160. The patterning slit sheet 130 may be disposed on the first stage 150 and the second stage 160 so as to move in the X-axis, Y-axis, and Z-axis directions, and the patterning slit sheet 130 may be aligned with the substrate 2 by using the first stage 150 and the second stage 160.

The upper housing 104, the first stage 150, and the second stage 160 may guide a flow path of the deposition material 115, and the deposition material 115 discharged through the deposition source nozzles 121 may not be dispersed outside the flow path. The flow path of the deposition material 115 may be defined by the upper housing 104, the first stage 150, and the second stage 160, and the movements of the deposition material 115 in the X-axis and Y-axis directions may be simultaneously guided.

The plurality of source shutters 140 may be disposed between the patterning slit sheet 130 and the deposition source 110. The plurality of source shutters 140 may shield the deposition material 115 emitted from the deposition source 110.

The deposition unit 100 may further include a shielding member for preventing deposition of the deposition material 115 on a non-film-forming region of the substrate 2. The shielding member may be configured to shield an edge of the substrate 2 and move together with the substrate 2, the non-film-forming region of the substrate 2 may be screened by the shielding member, and deposition of the deposition material 115 on the non-film-forming region of the substrate 2 may be effectively prevented, without using a separate structure. The shielding member may be disposed around the patterning slit sheet 130 to prevent deposition of the deposition material 115 on the non-film-forming region of the substrate 2 or on a region of the substrate 2 other than a region of the substrate 2 that is overlapped by the patterning slit sheet 130.

The deposition unit 100 may further include a plurality of source shutter driving units for respectively moving the plurality of source shutters 140. Each of the plurality of source shutter driving units may include a general motor and a gear assembly, or may include, for example, a cylinder, which may linearly move in one direction. The structure of the source shutter driving units is not limited thereto, and each source shutter driving unit may include all devices that linearly move each source shutter 140.

The conveyer unit 400 may convey the substrate 2, on which the deposition material 115 may be deposited. The conveyer unit 400 will now be described in more detail. Referring to FIGS. 2 and 3, the conveyer unit 400 may include the first conveyer unit 410, the second conveyer unit 420, and the moving unit 430.

The first conveyer unit 410 may convey in an in-line manner the moving unit 430 and the substrate 2 attached to the moving unit 430, and an organic layer may be formed on the substrate 2 by the fifth deposition assembly 100-5. The moving unit 430 may include a carrier 431 and an electrostatic chuck 432 attached thereto.

The second conveyer unit 420 may return the moving unit 430 without the substrate 2 thereon from the unloading unit 300 to the loading unit 200 after deposition is completed in the deposition unit 100. The second conveyer unit 420 may include a coil 421, roller guides 422, and a charging track 423.

The first conveyer unit 410 and the second conveyer unit 420 move the carrier 431 of the moving unit 430, and the electrostatic chuck 432 of the moving unit 430 may be combined on a surface of the carrier 431. The electrostatic chuck 432 may hold the substrate 2.

Each component of the conveyer unit 400 will now be described in more detail.

The carrier 431 of the moving unit 430 will be first described in detail.

The carrier 431 may include a main body part 431a, a linear motor system (LMS) magnet 431b, contactless power supply (CPS) modules 431c, a power supply unit 431d, and guide grooves.

The main body part 431a may constitute a base part of the carrier 431. The main body part 431a may include a magnetic material such as iron. Due to, for example, a repulsive force between the main body part 431a of the carrier 431 and magnetically suspended bearings included in the first conveyer unit 410, the carrier 431 may be held spaced apart from guide members 412 of the first conveyer unit 410 by a certain distance.

The guide grooves may be formed at both sides of the main body part 431a. Each guide groove may accommodate a guide protrusion of the guide member 412.

The LMS magnet 431b may extend along a center line of the main body part 431a in a direction in which the main body part 431a may proceed. The LMS magnet 431b may be combined with a coil 411, which is described later, to form a linear motor. The linear motor may convey the carrier 431 in an arrow A direction.

The LMS magnet 431b may be disposed between the CPS modules 431c and the power supply unit 431d in the main body part 431a. The power supply unit 431d may be a rechargeable battery that may provide power to the electrostatic chuck 432 that may chuck and hold the substrate 2. The CPS modules 431c may be wireless charging modules that may charge the power supply unit 431d. The charging track 423 of the second conveyer unit 420, which is described later, may be connected to an inverter that may transfer the carrier 431 into the second conveyer unit 420. A magnetic field may be formed between the charging track 423 and the CPS modules 431c to supply power to the CPS modules 431c. The power supplied to the CPS modules 431c may be used to charge the power supply unit 431d.

The electrostatic chuck 432 may include an electrode embedded in its main body formed of ceramic. The electrode may be supplied with power. Such an electrostatic chuck may fix the substrate 2 on a surface of the main body of the electrostatic chuck 432 using an electrostatic force generated from a high voltage applied to the electrode.

Next, an operation of the moving unit 430 will now be described in detail.

The LMS magnet 431b and the coil 411 may form an operation unit. The operation unit may be a linear motor. The linear motor may have a relatively small frictional coefficient, little position error, and a relatively high degree of position determination, as compared to a comparative slide guide system. As described above, the linear motor may include the coil 411 and the LMS magnet 431b. The LMS magnet 431b may be line-shaped and be disposed on the carrier 431, and a plurality of the coils 411 may be disposed over the LMS magnet 431b at a predetermined interval. Since the LMS magnet 431b, instead of the coil 411, may be disposed on the carrier 431, the carrier 431 may be moved without using power. The coil 411 may be formed in an atmosphere (ATM) box, and may be exposed to an air atmosphere, and the carrier 431, in which the LMS magnet 431b may be disposed, may run in the chamber 101 that may be maintained in vacuum.

The fifth deposition assembly 100-5 of the organic layer deposition apparatus 1 may further include a camera 170 for an aligning process. The fifth deposition assembly 100-5 may align, in real time, a mark formed on the patterning slit sheet 130 with a mark formed on the substrate 2 by using the camera 170. The camera 170 may be mounted such that its optical path to the frame 132 or the substrate 2 may not be blocked during the scanning deposition process. The camera 170 may be mounted in a camera accommodation unit 171 in an atmospheric state.

Figure 4:
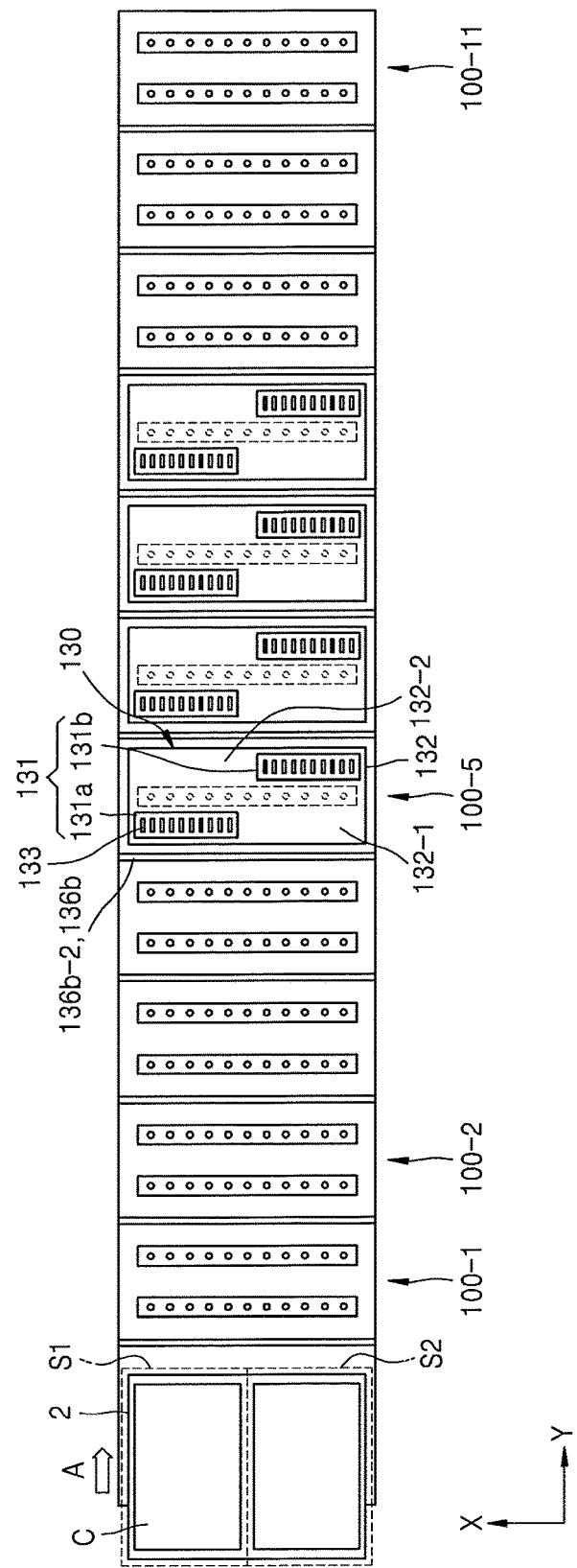
FIG. 4 illustrates a conceptual view of an embodiment of an arrangement of deposition sources and patterning slit sheets included in the organic layer deposition apparatus shown in FIG. 1.
Figure 5:
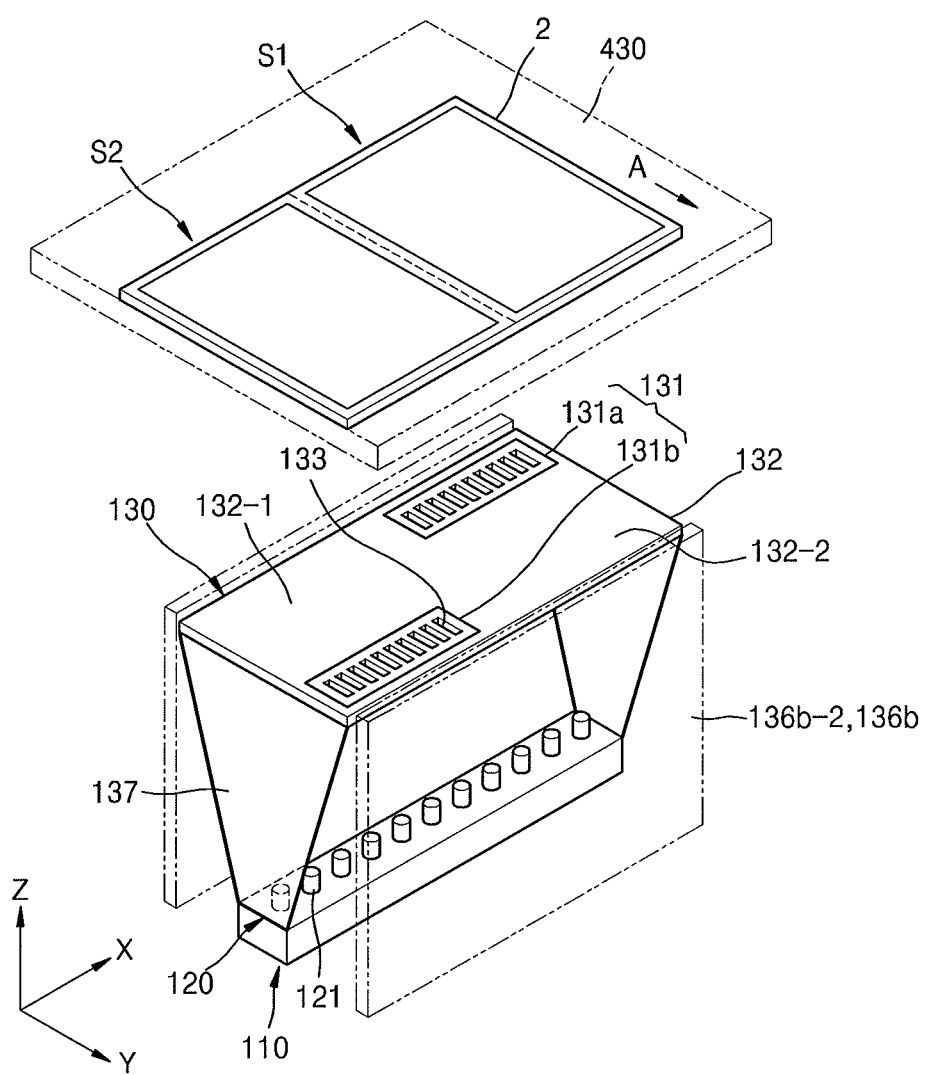
FIG. 5 illustrates a perspective view of a part of a modification of the organic layer deposition apparatus shown in FIG. 1.

FIG. 4 illustrates a conceptual view of an embodiment of an arrangement of deposition sources and patterning slit sheets of the organic layer deposition apparatus 1 shown in FIG. 1. FIG. 5 illustrates a perspective view of a part of a modification of the organic layer deposition apparatus 1 of FIG. 1.

Referring to FIGS. 4 and 5, shielding members may include second shielding members 136b. The second shielding members 136b may include first sub-shielding members. The first sub-shielding members may be mounted to be perpendicular to a lower surface of a chamber, and may be parallel to the proceeding direction of the substrate 2.

According to an embodiment, the second shielding members 136b may include first sub-shielding members and second sub-shielding members 136b-2. The first sub-shielding members may be mounted or disposed in the same manner as described above. The second sub-shielding members 136b-2 may be disposed to be perpendicular to a lower surface of the chamber 101. The second sub-shielding members 136b-2 may be disposed in a direction perpendicular to the proceeding direction of the substrate 2. For example, the second sub-shielding members 136b-2 may be arranged to partition a plurality of pattern sheets 131 in a transferring direction of the substrate 2. For convenience of description, an embodiment in which the second shielding members 136b only include the second sub-shielding members 136b-2 will now be described in detail.

As shown in FIG. 5, each patterning slit sheet 130 may include a pattern sheet 131 and a frame 132. A plurality of pattern sheets 131 may be included and may be spaced apart from one another.

A deposition material may pass through each of the plurality of pattern sheets 131 and be deposited on a plurality of different regions of the substrate 2. Two of the plurality of different regions of the substrate 2 may be parallel to each other. For example, two of the plurality of different regions of the substrate 2 may be parallel to the proceeding direction of the substrate 2 (or a first direction, i.e., the Y-axis direction).

The plurality of pattern sheets 131 may be arranged to have various configurations. For example, the plurality of pattern sheets 131 may be arranged on different planes. According to an embodiment, the plurality of pattern sheets 131 may be arranged on the same plane. The plurality of pattern sheets 131 may be arranged in parallel. The plurality of pattern sheets 131 may not be disposed on the same line.

The plurality of pattern sheets 131 may be arranged in a diagonal direction that may form a certain angle with the transferring direction of the substrate 2 (or a proceeding direction of organic layer deposition, i.e., a direction A). Adjacent pattern sheets 131 from among the plurality of pattern sheets 131 may zigzag about a straight line that is parallel to the transferring direction of the substrate 2 passing between the pattern sheets 131. Each pattern sheet 131 may be eccentric about the straight line that is parallel to the transferring direction of the substrate 2 passing between the pattern sheets 131. For example, the plurality of pattern sheets 131 may zigzag about the straight line that is parallel to the transferring direction of the substrate 2. For convenience of description, an embodiment in which the plurality of pattern sheets 131 are arranged on the same plane will now be described in detail.

Each pattern sheet 131 may include patterning slits 133 through which the deposition material may pass. Each pattern sheet 131 may include a plurality of patterning slits 133, and the plurality of patterning slits 133 may be spaced apart from one another in a length direction of the pattern sheet 131.

The number of pattern sheets 131 may be at least two. For convenience of description, an embodiment in which each patterning slit sheet 130 includes two pattern sheets 131 will now be described in detail.

The pattern sheets 131 may include a first pattern sheet 131a and a second pattern sheet 131b spaced apart from each other. The first pattern sheet 131a and the second pattern sheet 131b may be disposed on the same plane, and a lengthwise direction of the first pattern sheet 131a may be parallel to that of the second pattern sheet 131b.

The first pattern sheet 131a and the second pattern sheet 131b may have the same size or may have different sizes. For convenience of description, an embodiment in which the first pattern sheet 131a and the second pattern sheet 131b have the same size will now be described in detail.

The first pattern sheet 131a and the second pattern sheet 131b may be misaligned. For example, the first pattern sheet 131a and the second pattern sheet 131b may be arranged on opposite sides of the straight line that is parallel to the traveling direction of the substrate 2.

The first pattern sheet 131a and the second pattern sheet 131b may be disposed on different regions of the substrate 2. The first pattern sheet 131a and the second pattern sheet 131b may be used when different regions of the substrate 2 simultaneously undergo the deposition process.

The first pattern sheet 131a and the second pattern sheet 131b may be disposed to form certain angles with the transferring direction of the substrate 2. The first pattern sheet 131a and the second pattern sheet 131b may be disposed to be perpendicular to the transferring direction of the substrate 2.

The first pattern sheet 131a and the second pattern sheet 131b may be formed in the frame 132. The frame 132 may include openings to respectively form the first pattern sheet 131a and the second pattern sheet 131b therein.

The frame 132 may be formed to be larger than the first pattern sheet 131a and the second pattern sheet 131b. For example, a short (Y axis direction) or long (X axis direction) edge of the frame 132 may be longer than the first pattern sheet 131a and the second pattern sheet 131b.

The frame 132 may include a first shielding unit 132-1 formed on the same line as the first pattern sheet 131a, and a second shielding unit 132-2 formed on the same line as the second pattern sheet 131b. The first shielding unit 132-1 and the second shielding unit 132-2 may be adjacent to the first pattern sheet 131a and the second pattern sheet 131b.

The first shielding unit 132-1 may shield a deposition material that may be moving in the lengthwise direction of the first pattern sheet 131a. The second shielding unit 132-2 may shield a deposition material that may be moving in the lengthwise direction of the second pattern sheet 131b.

The first shielding unit 132-1 and the second shielding unit 132-2 may be formed as plates. A lattice of protrusions may be formed on a surface of each of the first and second shielding unit 132-1 and 132-2 that faces the deposition source 110, and deposition of the deposition material may be prevented.

At least one deposition source 110 may be arranged. The at least one deposition source 110 may be disposed between adjacent pattern sheets 131 from among the plurality of pattern sheets 131.

In the organic layer deposition apparatuses according to the above-described embodiments, a deposition source nozzle unit 120 of a deposition assembly may include a plurality of deposition source nozzles 121 arranged in a second direction (for example, the X-axis direction) that is perpendicular to the first direction (Y-axis direction) and is parallel to a direction in which the substrate 2 fixed to the moving unit 430 may be disposed. In an organic layer deposition apparatus according to an embodiment, the plurality of deposition source nozzles 121 of the deposition source nozzle unit 120 may be arranged in the first direction (Y-axis direction).

In the manufacturing of an organic light-emitting display apparatus, when an intermediate layer including an emission layer is formed, a single common layer may need to be formed over the entire portion of a display region, or a pattern layer may need to be formed over only a preset portion of the display region.

When the common layer is formed, the deposition source nozzle unit 120 of the deposition assembly may include a plurality of deposition source nozzles 121 arranged in the second direction (for example, the X-axis direction) that is perpendicular to the first direction (Y-axis direction) and is parallel to the direction in which the substrate 2 fixed to the moving unit 430 may be disposed, as described above, and thickness uniformity of the common layer may improve. When the pattern layer is formed, the deposition source nozzle unit 120 of the deposition assembly may include a plurality of deposition source nozzles 121 arranged in the first direction (Y-axis direction), and on a plane (ZX plane) perpendicular to the first direction (Y-axis direction), one deposition source nozzle 121 may be located in the second direction (for example, the X-axis direction) that is perpendicular to the first direction (Y-axis direction) and is parallel to the direction in which the substrate 2 fixed to the moving unit 430 may be disposed. Accordingly, when the pattern layer is formed, generation of a shadow may be greatly reduced. For convenience of description, an embodiment in which a plurality of deposition source nozzles 121 are arranged in the second direction will now be described in detail.

Although one deposition source and one deposition source nozzle unit are illustrated in FIG. 5, a first deposition source and a second deposition source may be sequentially arranged in the first direction (Y-axis direction), a plurality of deposition source nozzles of a first deposition source nozzle unit on the first deposition source may be arranged in the second direction (X-axis direction), and a plurality of deposition source nozzle of a second deposition source nozzle unit on the second deposition source may also be arranged in the second direction (X-axis direction).

The above-described patterning slit sheet 130 may have a shape shown in FIG. 5. As shown in FIG. 5, the patterning slit sheet 130 may include a frame 132 in which a plurality of openings may be formed, and pattern sheets 131 coupled to the frame 132 by, for example, welding. The pattern sheet 131 may include a plurality of patterning slits 133 arranged in the X-axis direction, for example. The deposition material located within a crucible of the deposition source 110 may be evaporated by a heater, emitted via the deposition source nozzles 121 of the deposition source nozzle unit 120, and seated on the substrate 2 via the patterning slits 133 of the patterning slit sheet 130. At least one of the deposition source 110 and the deposition source nozzle unit 120 may be connected to the patterning slit sheet 130 by using a connection member 137. The connection member 137 may guide a movement path of the deposition material emitted from the deposition source 110. For example, the connection member 137 may be able to completely seal a space between the deposition source 110, the deposition source nozzle unit 120, and the patterning slit sheet 130.

For convenience of description, an embodiment in which the organic layer deposition apparatus 1 includes a deposition assembly including no connection members 137 will now be described in detail.

A method of forming an organic layer via the organic layer deposition apparatus 1 will now be described with reference to FIGS. 1-5.

After the loading unit 200 fixes the substrate 2 to the moving unit 430, the moving unit 430 may be mounted on the first conveyer unit 410 via the first inversion chamber 218. The first conveyer unit 410 may enter the chamber 101 and sequentially pass through the first through eleventh deposition assemblies 100-1 through 100-11, and organic layers respectively corresponding to the first through eleventh deposition assemblies 100-1 through 100-11 may be formed. The formed organic layers may be different. Each of the organic layers may include an organic emission layer and may further include a hole injection layer (HIL), a hole transport layer (HTL), an electron transport layer (ETL), and an electron injection layer (EIL). The HIL, the HTL, the ETL, and the EIL may form a common layer, and the organic emission layer may form a pattern layer. The organic emission layer may vary depending on colors to be realized.

When the formation of the organic layers is completed, the substrate 2 may be separated from the moving unit 430 within the unloading unit 300 and be ejected to the outside. Thereafter, an opposite electrode may be formed on the organic layers, and then the organic layers are sealed with a thin-film encapsulation layer or an encapsulation substrate, and an organic light-emitting display apparatus may be completely manufactured.

In a method of forming such a pattern layer, the substrate 2 enters the fifth deposition assembly 100-5 while linearly moving as the first conveyer unit 410 moves.

When the deposition source 110 vaporizes or sublimates and then emits the deposition material, a deposition material that has passed through the first pattern sheet 131a and the second pattern sheet 131b may be deposited on the substrate 2. The deposition material may be deposited on different regions of the substrate 2. For example, a deposition material that has passed through the first pattern sheet 131a may be deposited on a first region S1 of the substrate 2. A deposition material that has passed through the second pattern sheet 131b may be deposited on a second region S2 of the substrate 2. The first region S1 and the second region S2 may not overlap each other, and the first region S1 and the second region S2 may be aligned in the proceeding direction of organic layer deposition (or the proceeding direction of the substrate 2, i.e., the direction A).

A boundary between the first region S1 and the second region S2 may be included in a cell C. A cell C may be formed to extend over the first region S1 and the second region S2. According to an embodiment, each of the first region S1 and the second region S2 may include a single cell C. For convenience of explanation, an embodiment in which a single cell C is disposed within each of the first and second regions S1 and S2 will now be described in detail.

While the deposition material is being deposited on the first region S1 after passing through the first pattern sheet 131a, the first shielding unit 132-1 disposed on the second region S2 adjacent to the first pattern sheet 131a may prevent deposition of the deposition material on the second region S2. While the deposition material is being deposited on the second region S2 after passing through the second pattern sheet 131b, the second shielding unit 132-2 may prevent deposition of the deposition material on the first region S1, similar to the first shielding unit 132-1.

Such organic layer deposition may continue as the substrate 2 is transferred. The second sub-shielding member 136b-2 may be mounted between adjacent deposition assemblies to prevent mixture of deposition materials used in different deposition assemblies. The second sub-shielding member 136b-2 may partition the chamber 101 into a plurality of spaces such that one deposition assembly may perform deposition within one space. The first pattern sheet 131a and the second pattern sheet 131b may be disposed within a single space defined by two second sub-shielding members 136b-2. According to an embodiment, a plurality of independent chambers 101 connected to one another may be disposed instead of the second sub-shielding members 136b-2, and one fifth deposition assembly 100-5 may be disposed within one chamber 101, and organic layers may be formed according to the same method as described above. For convenience of description, an embodiment in which one chamber 101 is partitioned into a plurality spaces by using a second sub-shielding member 136b-2 will now be described in detail.

The outer surface of the second sub-shielding member 136b-2 may have a lattice shape to prevent deposition of the deposition material on the outer surface of the second sub-shielding member 136b-2. The second sub-shielding member 136b-2 may be fixed to, for example, an inner surface, of the chamber 101.

The substrate 2 may have any of various sizes. The substrate 2 may be designed to form cells C of various shapes thereon in order to improve productivity. For example, to improve productivity, the substrate 2 may need to be large. To form a large substrate 2, a pattern sheet such as the above-described FMM may need to be manufactured to have a size that is almost the same as that of the substrate 2. However, the pattern sheet may be deformed or sagged due to, for example, a load of the pattern sheet, and the location of an organic layer that may be formed via the pattern sheet may not be precise, and the error rate of products may be increased.

Embodiments may use a plurality of pattern sheets 131, and may minimize deformation or sagging of each pattern sheet 131. In embodiments, deposition may be performed on the entire area of the substrate 2 even when the size of the substrate 2 increases, and productivity may be improved.

Due to, for example, the minimization of deformation or sagging of each pattern sheet 131, a precise organic layer may be formed.

Figure 6:
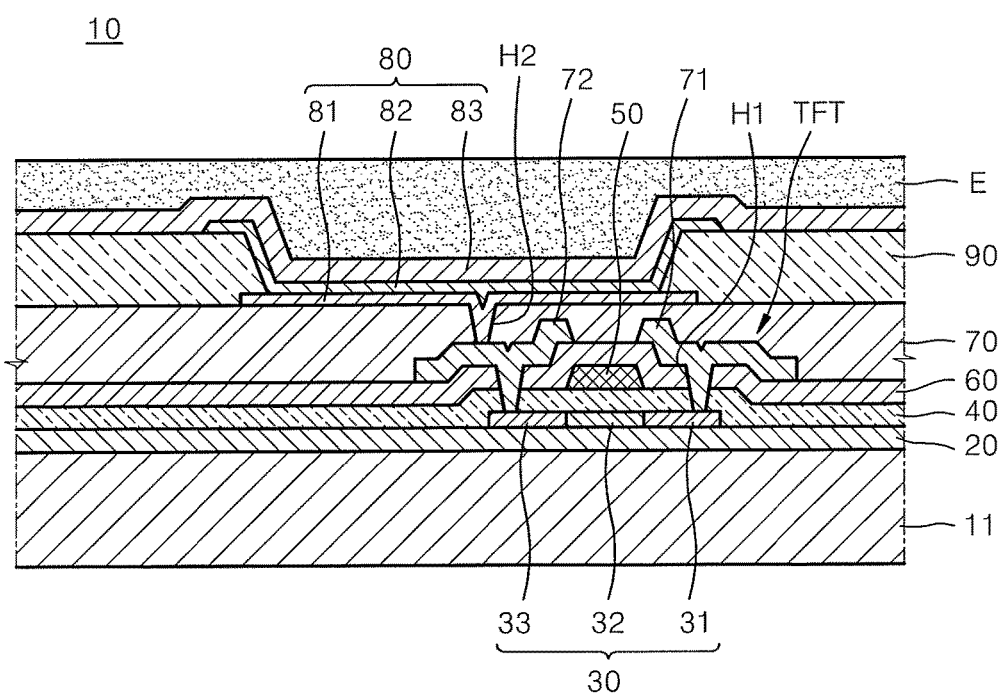
FIG. 6 illustrates a cross-sectional view of a portion of an organic light-emitting display apparatus manufactured by the organic layer deposition apparatus shown in FIG. 1.

FIG. 6 illustrates a cross-sectional view of a portion of an organic light-emitting display apparatus 10 manufactured by the organic layer deposition apparatus 100 of FIG. 1.

Referring to FIG. 6, the organic light-emitting display apparatus 10 may include a first substrate 11 and a light-emission unit. The organic light-emitting display apparatus 10 may also include a thin-film encapsulation layer E or a second substrate formed on an upper surface of the light-emission unit. The first substrate 11 may be formed of the same material as that used to form the substrate 2. For example, the first substrate 11 may be obtained by cutting the substrate 2 into a plurality of substrates after the organic light-emitting display apparatus 10 is formed. The second substrate may be the same as or similar to a second substrate used in a general organic light-emitting display apparatus, and a detailed description thereof will be omitted herein. For convenience of description, an embodiment in which the organic light-emitting display apparatus 10 includes the thin-film encapsulation layer E will now be described in detail.

The light-emission unit may be formed on the first substrate 11. The light-emission unit may include a thin film transistor TFT, a passivation layer 70 covering the thin film transistor TFT, and an organic light-emitting diode (OLED) 80 formed on the passivation layer 70.

The first substrate 11 may be formed of, for example, a glass material. The first substrate 11 may be formed of a plastic material or a metal material, such as, steel use stainless (SUS) or titanium (Ti). In an embodiment, the first substrate 11 may use polyimide (PI). For convenience of description, an embodiment in which the first substrate 11 is formed of a glass material will now be described in detail.

A buffer layer 20 formed of an organic compound and/or an inorganic compound is further formed on an upper surface of the first substrate 11. The buffer layer 20 may be formed of silicon oxide ($SiO_x$) ($x \geq 1$) or silicon nitride ($SiN_x$) ($x \geq 1$).

An active layer 30 arranged in a predetermined pattern may be formed on the buffer layer 20 and may then be buried by a gate insulating layer 40. The active layer 30 may include a source region 31 and a drain region 33 and may further include a channel region 32 therebetween.

The active layer 30 may be formed to include various materials. For example, the active layer 30 may include an inorganic semiconductor material such as amorphous silicon or crystalline silicon. As another example, the active layer 30 may include an oxide semiconductor. As another example, the active layer 30 may include an organic semiconductor material. For convenience of description, an embodiment in which the active layer 30 is formed of amorphous silicon will now be described in detail.

The active layer 30 may be formed by forming an amorphous silicon layer on the buffer layer 20, crystallizing the amorphous silicon layer to form a polycrystalline silicon layer, and patterning the polycrystalline silicon layer. The source region 30 and the drain region 33 of the active layer 31 may be doped with impurities according to a TFT type, such as, for example, a driving TFT or a switching TFT.

A gate electrode 50 facing the active layer 30 and an interlayer insulating layer 60 that buries the gate electrode 50 may be formed on an upper surface of the gate insulating layer 40.

Contact holes H1 may be formed in the interlayer insulating layer 60 and the gate insulating layer 40, and then a source electrode 71 and a drain electrode 72 may be formed on the interlayer insulating layer 60 such that the source electrode 71 and the drain electrode 72 contact the source region 31 and the drain region 33, respectively.

The passivation layer 70 may be formed on the thin film transistor TFT formed as described above, and a pixel electrode 81 of the OLED 80 may be formed on the passivation layer 70. The pixel electrode 81 may contact the drain electrode 72 of the thin-film transistor TFT through a via hole H2 formed in the passivation layer 72. The passivation layer 70 may be formed of an inorganic material and/or an organic material and as a single layer or multiple layers. The passivation layer 70 may be formed as a planarization layer such that an upper surface thereof is flat regardless of the unevenness of a lower layer under the passivation layer 70. In an embodiment, the passivation layer 70 may be formed to be uneven according to the unevenness of the lower layer. The passivation layer 70 may be formed of a transparent insulator, and a resonance effect may be achieved.

After forming the pixel electrode 81 on the passivation layer 70, a pixel-defining layer 90 may be formed of an organic material and/or an inorganic material such that the pixel-defining layer 90 covers the pixel electrode 81 and the passivation layer 70. The pixel-defining layer 90 may have an aperture via which the pixel electrode 81 may be exposed.

An intermediate layer 82 and an opposite electrode 83 may be formed on at least the pixel electrode 81.

The pixel electrode 81 may function as an anode, and the opposite electrode 83 may function as a cathode. In an embodiment, the pixel electrode 81 may function as a cathode, and the opposite electrode 83 may function as an anode.

The pixel electrode 81 and the opposite electrode 83 may be insulated from each other by the intermediate layer 82, and may respectively apply voltages of opposite polarities to the intermediate layer 82 to induce light emission in an organic emission layer.

The intermediate layer 82 may include an organic emission layer. For example, the intermediate layer 82 may include an organic emission layer. The intermediate layer 282 may further include at least one of a hole injection layer (HIL), a hole transport layer (HTL), an electron transport layer (ETL), and an electron injection layer (EIL). The present embodiment is not limited thereto, and the intermediate layer 82 may further include various other functional layers in addition to an organic emission layer.

One unit pixel may include a plurality of sub-pixels, and the plurality of sub-pixels may emit light of various colors. For example, the unit pixel may include a plurality of sub-pixels which respectively emit red light, green light, and blue light, or a plurality of sub-pixels which respectively emit red light, green light, blue light, and white light.

The thin-film encapsulation layer E may include a plurality of inorganic layers or include an inorganic layer and an organic layer.

The organic layer of the thin-film encapsulation layer E may be formed of a polymer and may be a single layer or a layer stack formed of polyethylene terephthalate (PET), PI, polycarbonate (PC), epoxy, polyethylene, or polyacrylate. The organic layer may be formed of polyacrylate. The organic layer may include a result of polymerizing a monomer composition including a diacrylate-based monomer and a triacrylate-based monomer. The monomer composition may further include monoacrylate-based monomer. The monomer composition may further include a well-known photoinitiator such as, for example, trimethyl benzoyl diphenyl phosphine oxide (TPO).

The inorganic layer of the thin-film encapsulation layer E may be a single layer or a layer stack including metal oxide or metal nitride. The inorganic layer may include $SiN_x$, $Al_2O_3$, $SiO_2$, or $TiO_2$.

An uppermost layer exposed to the outside in the thin-film encapsulation layer E may be formed of an inorganic layer to prevent infiltration of moisture to the OLED 80.

The thin-film encapsulation layer E may include at least one sandwich structure in which at least one organic layer is interposed between at least two inorganic layers. In an embodiment, the thin-film encapsulation layer E may include at least one sandwich structure in which at least one inorganic layer is interposed between at least two organic layers. In an embodiment, the thin-film encapsulation layer E may include a sandwich structure in which at least one organic layer is interposed between at least two inorganic layers and a sandwich structure in which at least one inorganic layer is interposed between at least two organic layers.

The thin-film encapsulation layer E may include a first inorganic layer, a first organic layer, and a second inorganic layer sequentially formed starting from an upper portion of the OLED 80.

In an embodiment, the thin-film encapsulation layer E may include a first inorganic layer, a first organic layer, a second inorganic layer, a second organic layer, and a third inorganic layer sequentially formed starting from the upper portion of the OLED 80.

In an embodiment, the thin-film encapsulation layer E may include a first inorganic layer, a first organic layer, a second inorganic layer, a second organic layer, a third inorganic layer, a third organic layer, and a fourth inorganic layer sequentially formed starting from the upper portion of the OLED 80.

A halogenated metal layer including lithium fluoride (LiF) may be further included between the OLED 80 and the first inorganic layer. The halogenated metal layer may prevent the OLED 80 from being damaged when the first inorganic layer is formed by sputtering.

The first organic layer may have a smaller area than the second inorganic layer, and the second organic layer may also have a smaller area than the third inorganic layer.

In the organic light-emitting display apparatus 10 described above, the intermediate layer 82, which may be an organic layer, may be manufactured using the organic layer deposition apparatus 1 described above with reference to FIGS. 1-5.

The organic light-emitting display apparatus 10 may include the intermediate layer 82 in a precise pattern. The organic light-emitting display apparatus 10 may provide high light-emission performance and may have a minimum number of defective pixels.

Figure 7:
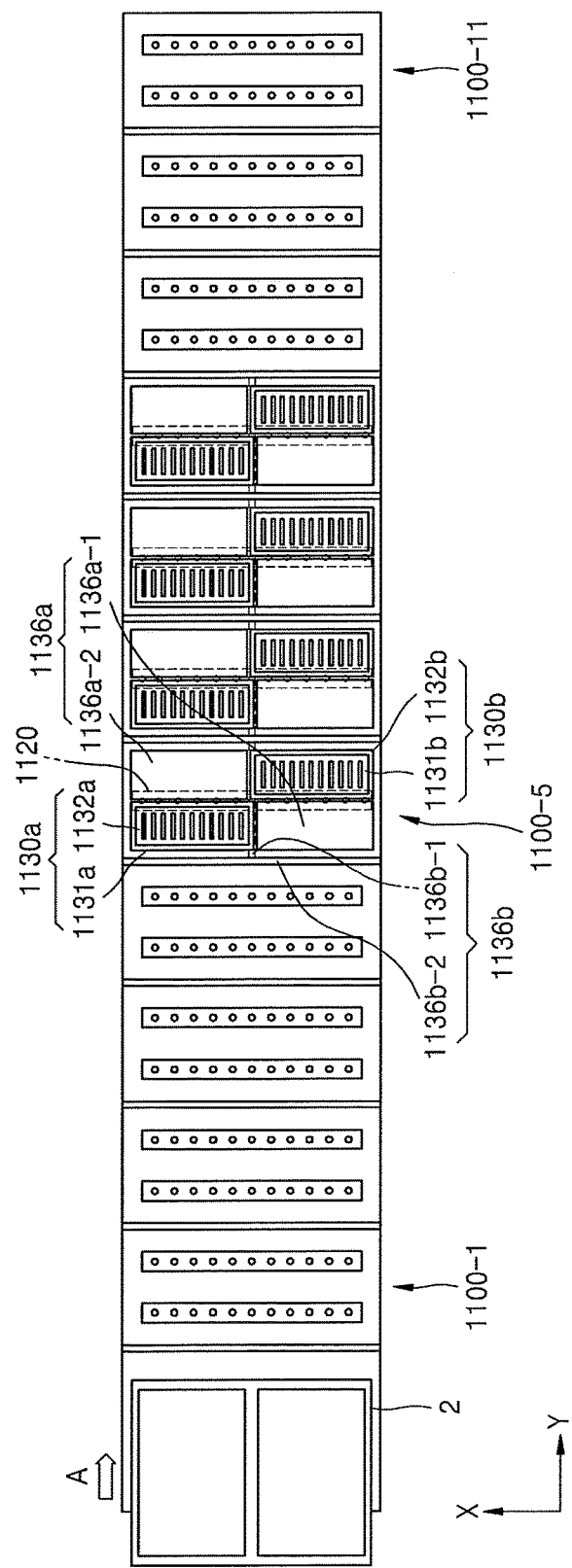
FIG. 7 illustrates a conceptual view of an arrangement of deposition sources and patterning slit sheets included in an organic layer deposition apparatus according to an embodiment.
Figure 8:
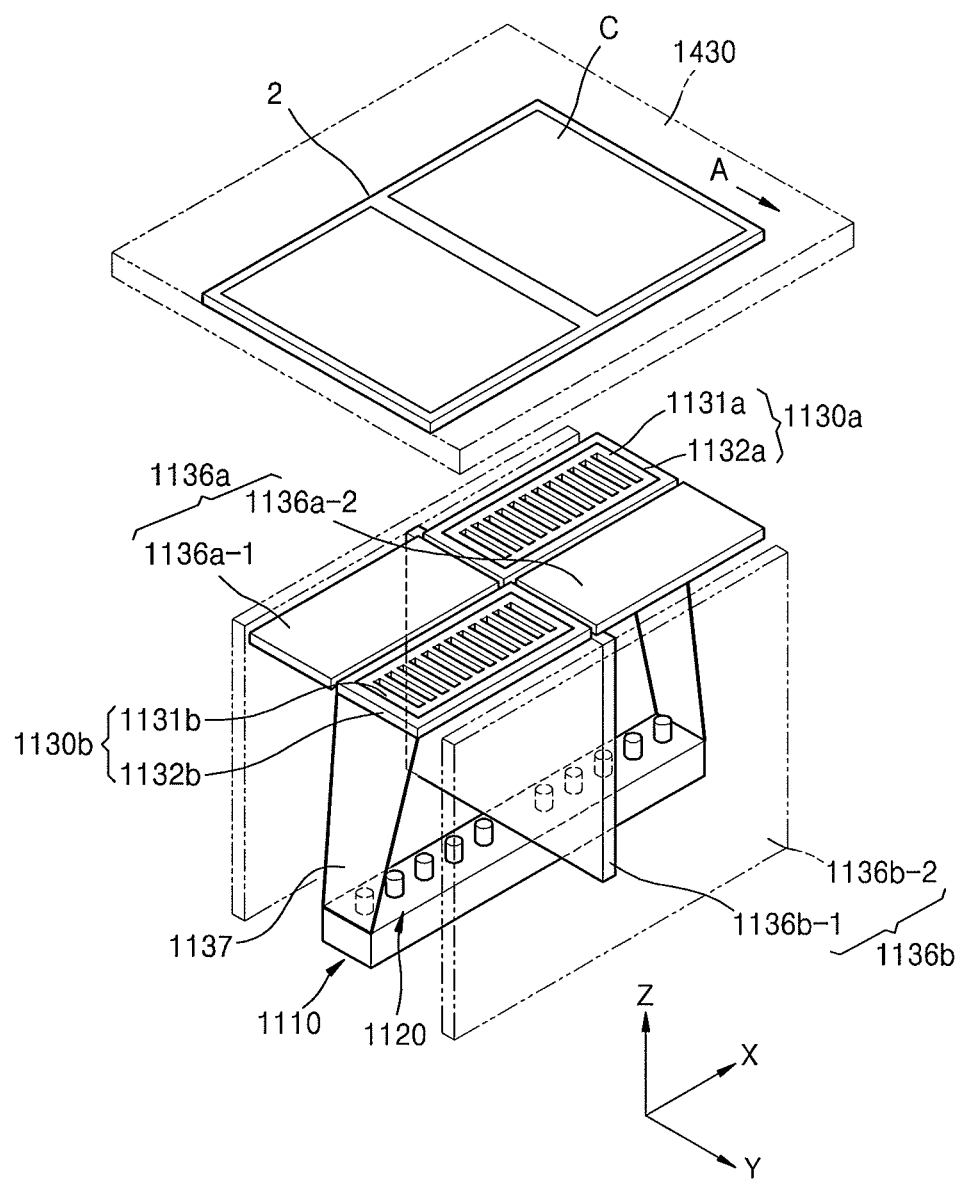
FIG. 8 illustrates a schematic perspective view of a part of a modification of a deposition assembly included in the organic layer deposition apparatus shown in FIG. 7.

FIG. 7 illustrates a conceptual view of an arrangement of deposition sources and patterning slit sheets of an organic layer deposition apparatus according to an embodiment. FIG. 8 illustrates a schematic perspective view of a part of a modification of a deposition assembly of the organic layer deposition apparatus shown in FIG. 7.

Referring to FIGS. 7 and 8, the organic layer deposition apparatus may be similar to the organic layer deposition apparatus 1 of FIG. 1. Components of the organic layer deposition apparatus that are different from those of the organic layer deposition apparatus 1 of FIG. 1 will now be focused in detail.

A fifth deposition assembly 1100-5 of the organic layer deposition apparatus may include a deposition source 1110 and a patterning slit sheet. The deposition source 1110 may be the same as or similar to the deposition source 110 described above, and a detailed description thereof is omitted herein.

The patterning slit sheet may include a first patterning slit sheet 1130a and a second patterning slit sheet 1130b spaced apart from each other. The first patterning slit sheet 1130a may include a first pattern sheet 1131a and a first frame 1132a, and the second patterning slit sheet 1130b may include a second pattern sheet 1131b and a second frame 1132b. The first frame 1132a and the second frame 1132b may be formed to be larger than the first pattern sheet 1131a and the second pattern sheet 1131b, respectively. The first frame 1132a may include a portion in which the first pattern sheet 1131a is provided, and a first shielding unit formed to be adjacent to the first pattern sheet 1131a and the second pattern sheet 1131b. The second frame 1132b may include a portion in which the second pattern sheet 1131b is provided, and a second shielding unit formed to be adjacent to the second pattern sheet 1131b and the first pattern sheet 1131a. According to an embodiment, the first frame 1132a and the second frame 1132b may not include the first shielding unit and the second shielding unit, respectively, and the first pattern sheet 1131a and the second pattern sheet 1131b may be fixed to a chamber, respectively. For convenience of description, an embodiment in which the first frame 1132a and the second frame 1132b do not include the first shielding unit and the second shielding unit, respectively will now be described in detail.

The first frame 1132a and the second frame 1132b may be connected to each other and may be integrally formed with each other. According to an embodiment, the first frame 1132a and the second frame 1132b may be formed to be separate from each other. For convenience of description, an embodiment in which the first frame 1132a and the second frame 1132b are formed separately from each other and are distinguished from each other will now be described in detail.

The first frame 1132a and the second frame 1132b may be disposed on the same plane. According to an embodiment, the first frame 1132a and the second frame 1132b may be disposed on different planes. For example, the first frame 1132a and the second frame 1132b may be disposed on one another in a vertical direction. For convenience of description, an embodiment in which the first frame 1132a and the second frame 1132b are arranged on the same plane will now be described in detail.

The first frame 1132a and the second frame 1132b may zigzag with respect to the direction in which the substrate 2 may be transferred. The first frame 1132a and the second frame 1132b may be disposed obliquely with respect to the direction in which the substrate 2 may be transferred. The first frame 1132a and the second frame 1132b may be disposed to partially overlap each other. The first frame 1132a and the second frame 1132b may appear to at least partially overlap each other, as viewed in the Y-axis direction of FIG. 7.

When the first frame 1132a and the second frame 1132b are partially overlapped with each other as described above, the first pattern sheet 1131a and the second pattern sheet 1131b may be disposed such that one end of the first pattern sheet 1131a may be connected to one end of the second pattern sheet 1131b, and the first pattern sheet 1131a and the second pattern sheet 1131b may function as a single pattern sheet. One end of the first pattern sheet 1131a may not be spaced apart from one end of the second pattern sheet 1131*b*, and patterning slits formed in the first pattern sheet 1131*a* may maintain constant distances from patterning slits formed in the second pattern sheet 1131*b*. When the first pattern sheet 1131*a* and the second pattern sheet 1131*b* form a pattern of a deposition material within a single cell C, the deposition material may be deposited on the substrate 2 to have a uniform pattern.

A boundary between the first pattern sheet 1131*a* and the second pattern sheet 1131*b* may be aligned with the boundary between cells C on the substrate 2. According to an embodiment, the boundary between the first pattern sheet 1131*a* and the second pattern sheet 1131*b* may be disposed within a cell C on the substrate 2. For convenience of explanation an embodiment in which the boundary between the first pattern sheet 1131*a* and the second pattern sheet 1131*b* are aligned with the boundary between cells C on the substrate 2 will now be described in detail.

A shielding member partitioning the inside space of a chamber may include a first shielding member 1136*a* and a second shielding member 1136*b*. The first shielding members 1136*a* may include a first upper shielding member 1136*a*-1 and a second upper shielding member 1136*a*-2.

The first upper shielding member 1136*a*-1 may be disposed adjacent to the first pattern sheet 1131*a* and the second pattern sheet 1131*b*. The first upper shielding member 1136*a*-1 may be disposed side by side with the first pattern sheet 1131*a* in a lengthwise direction of the first pattern sheet 1131*a*. The first upper shielding member 1136*a*-1 may be located at a same or similar position as or to that of the first shielding unit 132-1 of FIG. 5, and may perform a same or similar role as or to that of the first shielding unit 132-1 of FIG. 5.

The second upper shielding member 1136*a*-2 may be disposed adjacent to the second pattern sheet 1131*b* and the first pattern sheet 1131*a*. The second upper shielding member 1136*a*-2 may be disposed side by side with the second pattern sheet 1131*b* in a lengthwise direction of the second pattern sheet 1131*b*. The second upper shielding member 1136*a*-2 may be located at a same or similar position as or to that of the second shielding unit 132-2 of FIG. 5, and may perform a same or similar role as or to that of the second shielding unit 132-2 of FIG. 5.

The second shielding members 1136*b* may include a first sub-shielding member 1136*b*-1 and a second sub-shielding member 1136*b*-2. The first sub-shielding member 1136*b*-1 and the second sub-shielding member 1136*b*-2 may be the same as or similar to the first and second sub-shielding members described above with reference to FIGS. 4 and 5, and a detailed description thereof will be omitted here.

The second shielding member 1136*b* may partition the inside space of the chamber. The first sub-shielding member 1136*b*-1 and the second sub-shielding member 1136*b*-2 may enable the first pattern sheet 1131*a* and the second pattern sheet 1131*b* to be disposed in different spaces. The second sub-shielding member 1136*b*-2 may form different spaces, and each deposition assembly 1100-*n* may be disposed on each space. In an embodiment, instead of the second sub-shielding members 1136*b*-2 being formed, a plurality of chambers may be formed and connected to one another, and a deposition unit of the organic layer deposition apparatus may be disposed in each of the plurality of chambers.

According to an embodiment of the organic layer deposition apparatus, as shown in FIG. 8, the organic layer deposition apparatus may include a connection member 1137. The connection member 1137 may be the same as or similar to the connection member 137 described above, and a detailed description thereof is omitted herein. For convenience of description, a method of forming an organic layer by using the organic layer deposition apparatus when no connection members 1137 are included will now be described in detail.

In an operation of the organic layer deposition apparatus, when the substrate 2 is loaded and is then moved over the deposition source 1110, a deposition material vaporized or sublimated by the deposition source 1110 may be deposited on the substrate 2. At this time, the deposition material may be simultaneously deposited on different areas on the substrate 2 via the first pattern sheet 1131*a* and the second pattern sheet 1131*b*. The different areas on the substrate 2 may not overlap each other.

While the deposition process is being conducted, the first shielding member 1136*a* and the second shielding member 1136*b* may prevent the deposition material emitted from the deposition source 1110 from moving toward spaces other than the first pattern sheet 1131*a* and the second pattern sheet 1131*b*. For example, the first shielding member 1136*a* may prevent deposition of the deposition material on areas on the substrate 2 below which the first pattern sheet 1131*a* and the second pattern sheet 1131*b* are not arranged.

In the organic layer deposition apparatus and a method of manufacturing an organic light-emitting display apparatus by using the organic layer deposition apparatus, a plurality of pattern sheets 1131 are used, and deformation or sagging of each pattern sheet 1131 may be minimized. In embodiments, deposition may be performed on the entire area of the substrate 2 even when the size of the substrate 2 increases, and productivity may be improved. Due to, for example, the minimization of deformation or sagging of each pattern sheet 1131, a precise organic layer may be formed.

Figure 9:
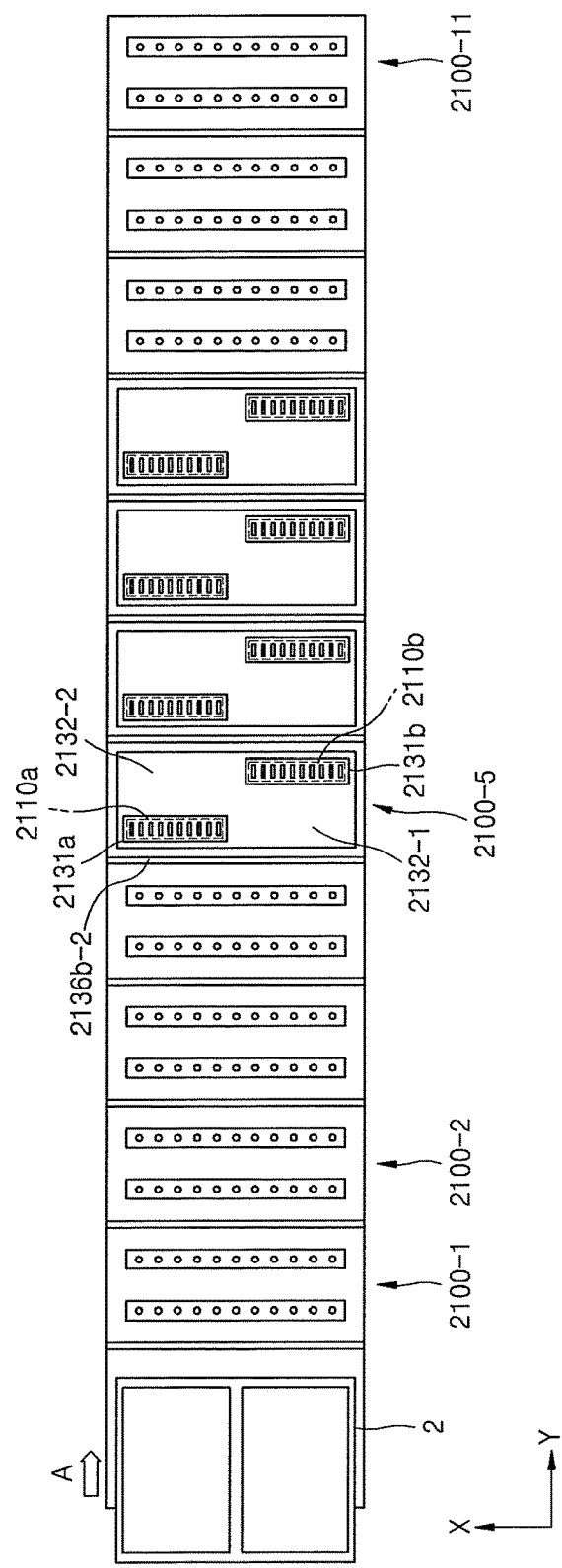
FIG. 9 illustrates a conceptual view of an arrangement of deposition sources and patterning slit sheets included in an organic layer deposition apparatus according to an embodiment.
Figure 10:
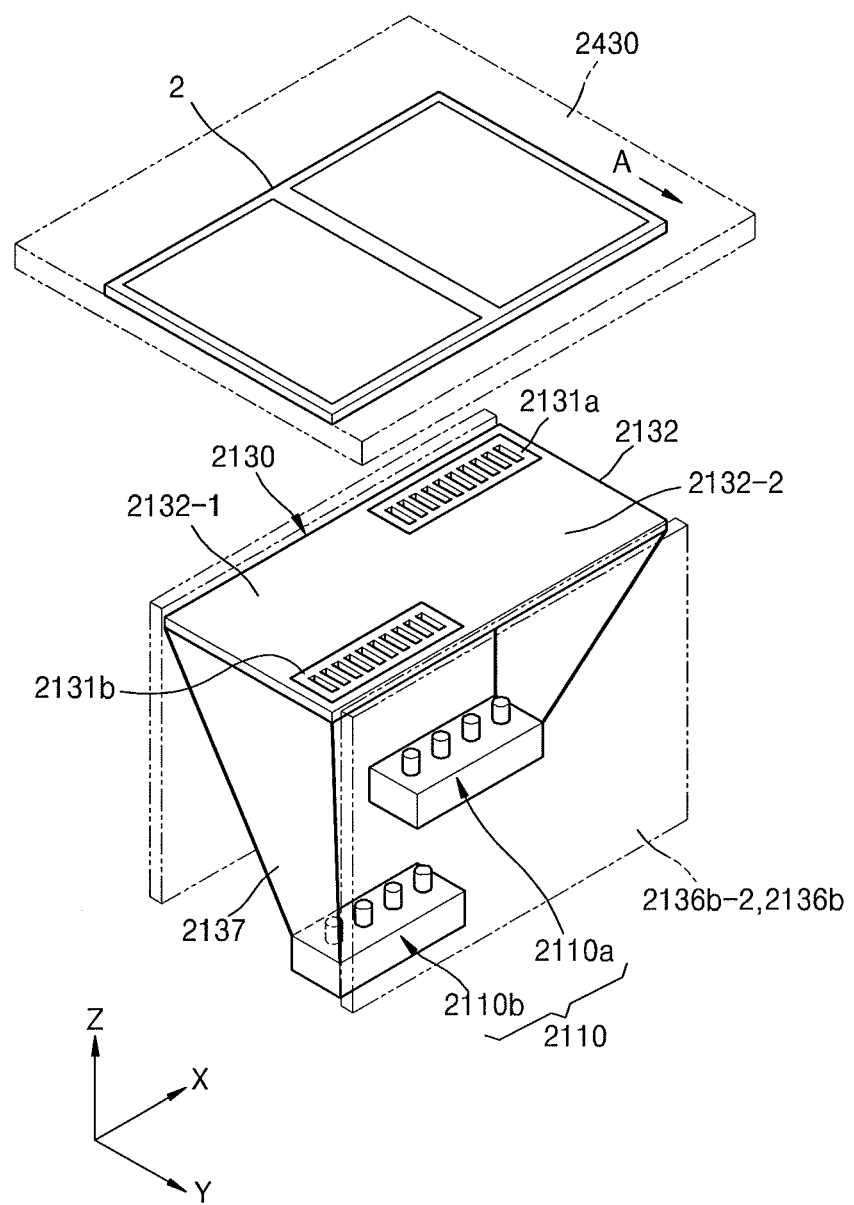
FIG. 10 illustrates a schematic perspective view of a part of a modification of a deposition assembly included in the organic layer deposition apparatus shown in FIG. 9.

FIG. 9 illustrates a conceptual view of an arrangement of deposition sources and patterning slit sheets of an organic layer deposition apparatus according to an embodiment. FIG. 10 illustrates a schematic perspective view of a part of a modification of a deposition assembly of the organic layer deposition apparatus shown in FIG. 9.

Referring to FIGS. 9 and 10, the organic layer deposition apparatus may be similar to the organic layer deposition apparatus 1 of FIG. 1. Components of the organic layer deposition apparatus that are different from those of the organic layer deposition apparatus 1 of FIG. 1 will now be focused in detail.

A fifth deposition assembly 2100-5 of the organic layer deposition apparatus may include a deposition source 2110 and a patterning slit sheet 2130.

The patterning slit sheet 2130 may include pattern sheets 2131*a* and 2131*b* and a frame 2132. The pattern sheets 2131*a* and 2131*b* may include a first pattern sheet 2131*a* and a second pattern sheet 2131*b* through which a deposition material may pass toward different areas on the substrate 2.

The first pattern sheet 2131*a* and the second pattern sheet 2131*b* may be formed in the frame 2132. The frame 2132 may include a first shielding unit 2132-1 and a second shielding unit 2132-2. The first shielding unit 2132-1 and the second shielding unit 2132-2 may be the same as or similar to the first and second shielding members 132-1 and 132-2 described above with reference to FIGS. 4 and 5, and a detailed description thereof will be omitted here.

The frame 2132 may fix the first pattern sheet 2131*a* and the second pattern sheet 2131*b*, and the first shielding member 1136*a* shown in FIGS. 7 and 8 may be disposed in portions of the frame 2132 in which the first shielding unit 2132-1 and the second shielding unit 2132-2 may be formed. The first shielding member 1136*a* may be the same as or similar to that described above with reference to FIGS. 7 and 8, and a detailed description thereof is omitted herein. For convenience of explanation, an embodiment in which the frame 2132 includes a first shielding unit 2132 and a second shielding unit 2132 will now be described in detail.

The deposition source 2110 may include a first deposition source 2110a and a second deposition source 2110b. The first deposition source 2110a and the second deposition source 2110b may be the same as or similar to the deposition source 110 described above with reference to FIGS. 1-4, and a detailed description thereof is omitted herein.

The deposition source 2110a and the second deposition source 2110b may vaporize or sublimate the same deposition material. The first deposition source 2110a and the second deposition source 2110b may face the first pattern sheet 2131a and the second pattern sheet 2131b, respectively. For example, the first deposition source 2110a may be disposed below the first pattern sheet 2131a, and the second deposition source 2110b may be disposed below the second pattern sheet 2131b. Positions of the first deposition source 2110a and the second deposition source 2110b are not limited thereto, and the first deposition source 2110a and the second deposition source 2110b may be at all positions where the deposition material vaporized or sublimated by the first deposition source 2110a and the second deposition source 2110b may pass through the first pattern sheet 2131a and the second pattern sheet 2131b and may be deposited on different areas on the substrate 2. For convenience of explanation, an embodiment in which the first deposition source 2110a and the second deposition source 2110b are respectively arranged over the center of the first pattern sheet 2131a and the center of the second pattern sheet 2131b will now be described in detail.

The first deposition source 2110a and the second deposition source 2110b may be disposed in a similar manner to the first pattern sheet 2131a and the second pattern sheet 2131b. The first deposition source 2110a and the second deposition source 2110b may be disposed within a single space, or a shielding member may be provided between the first deposition source 2110a and the second deposition source 2110b, and the first deposition source 2110a and the second deposition source 2110b may be disposed in different spaces. For convenience of description, an embodiment in which the first deposition source 2110a and the second deposition source 2110b are disposed within the same space will now be described in detail.

A shielding member may include a second shielding member 2136b. The second shielding members 2136b may include a second sub-shielding member 2136b-2. The second sub-shielding member 2136b-2 may partition the inside space of a chamber, and the fifth deposition assembly 2100-5 may be disposed within a different space from a deposition assembly adjacent thereto.

According to an embodiment, the organic layer deposition apparatus may further include a connection member 2137. The connection member 2137 may be the same as or similar to the connection member 137 described above with reference to FIGS. 1-5, and a detailed description thereof is omitted herein.

The organic layer deposition apparatus may form an organic layer on the substrate 2. When the substrate 2 is transferred, the first deposition source 2110a and the second deposition source 2110b may emit a deposition material and deposit the deposition material on the substrate 2 via the first pattern sheet 2131a and the second pattern sheet 2131b to have a pattern. The deposition material may be deposited on the substrate 2 to have a stripe type.

While the deposition material is being deposited as described above, the first shielding unit 2132-1, the second shielding unit 2132-2, and the second sub-shielding member 2136b-2 may prevent a deposition material from being emitted from the first deposition source 2110a and the second deposition source 2110b toward areas of the substrate 2 other than areas of the substrate 2 where the first pattern sheet 2131a and the second pattern sheet 2131b are disposed. The second sub-shielding member 2136b-2 may prevent mixture of a deposition material by separating adjacent deposition assemblies from each other.

In the organic layer deposition apparatus and a method of manufacturing an organic light-emitting display apparatus by using the organic layer deposition apparatus, a plurality of pattern sheets 2131a and 2131b are used, and deformation or sagging of each pattern sheet 2131a or 2131b may be minimized. In the organic layer deposition apparatus and the method of manufacturing an organic light-emitting display apparatus by using the organic layer deposition apparatus, deposition may be performed on the entire area of the substrate 2 even when the size of the substrate 2 increases, and productivity may be improved. Due to, for example, the minimization of deformation or sagging of each pattern sheet 2131a or 2131b, a precise organic layer may be formed.

Figure 11:
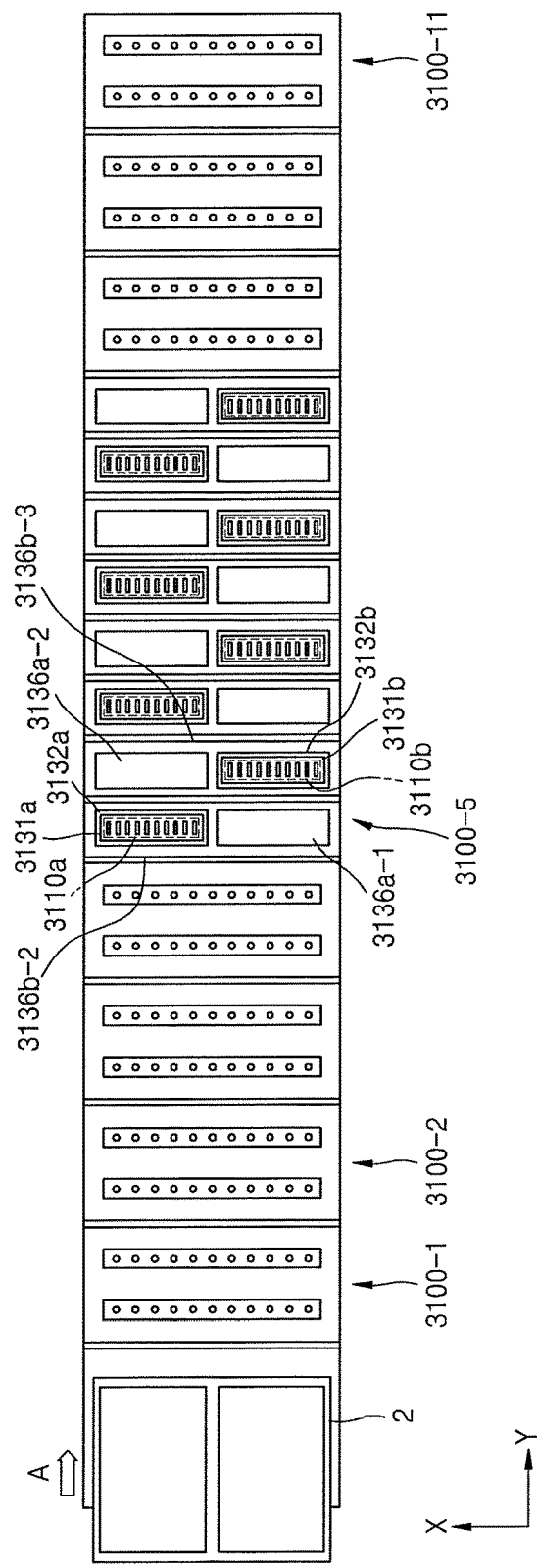
FIG. 11 illustrates a conceptual view of an arrangement of deposition sources and patterning slit sheets included in an organic layer deposition apparatus according to an embodiment.
Figure 12:
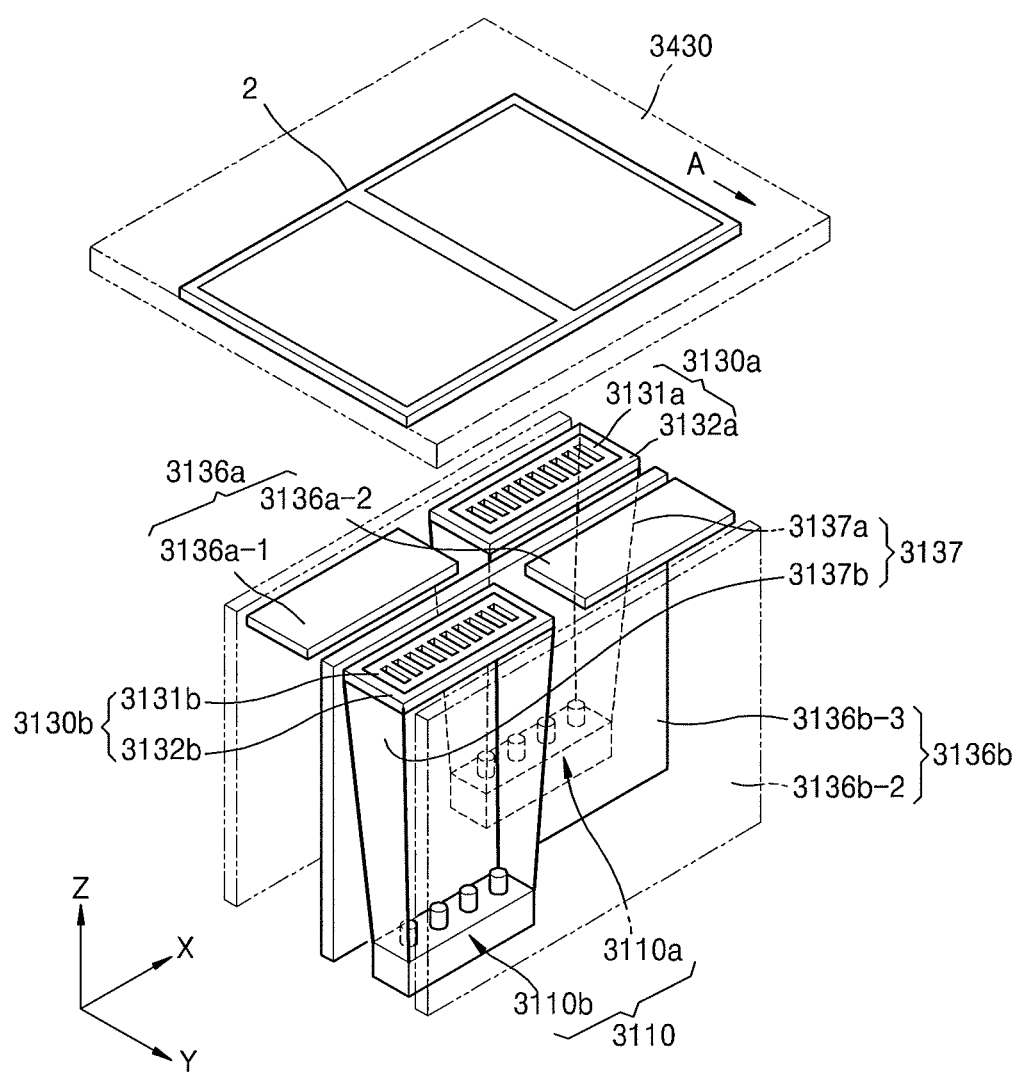
FIG. 12 illustrates a schematic perspective view of a part of a modification of a deposition assembly included in the organic layer deposition apparatus shown in FIG. 11.

FIG. 11 illustrates a conceptual view of an arrangement of deposition sources and patterning slit sheets of an organic layer deposition apparatus according to an embodiment. FIG. 12 illustrates a schematic perspective view of a part of a modification of a deposition assembly of the organic layer deposition apparatus shown in FIG. 11.

Referring to FIG. 11, the organic layer deposition apparatus may be formed in a similar manner to the organic layer deposition apparatus 1 of FIG. 1. Components of the organic layer deposition apparatus that are different from those of the organic layer deposition apparatus 1 of FIG. 1 will now be focused in detail.

A fifth deposition assembly 3100-5 of the organic layer deposition apparatus may include a deposition source 3110 and a patterning slit sheet.

The deposition source 3110 may include a first deposition source 3110a and a second deposition source 3110b. The first deposition source 3110a and the second deposition source 3110b may be the same as or similar to the first and second deposition sources 2110a and 2110b described above with reference to FIGS. 9 and 10, and a detailed description thereof is omitted herein.

The patterning slit sheet may include a first patterning slit sheet 3130a and a second patterning slit sheet 3130b. The first patterning slit sheet 3130a may include a first pattern sheet 3131a and a first frame 3132a, and the second patterning slit sheet 3130b may include a second pattern sheet 3131b and a second frame 3132b. The first patterning slit sheet 3130a and the second patterning slit sheet 3130b may be the same as or similar to the first and second patterning slit sheets 1130a and 1130b described above with reference to FIGS. 7 and 8, and a detailed description thereof is omitted herein.

A shielding member may include a first shielding member 3136a and a second shielding member 3136b. The first shielding members 3136a may include a first upper shielding member 3136a-1 and a second upper shielding member 3136a-2. The first upper shielding member 3136a-1 and the second upper shielding member 3136a-2 may be the same as or similar to those described above, and a detailed description thereof will be omitted here.

The second shielding members 3136*b* may include a second sub-shielding member 3136*b*-2 and a third sub-shielding member 3136*b*-3. The second sub-shielding member 3136*b*-2 may be the same as or similar to that described above, and a detailed description thereof is omitted herein.

The third sub-shielding member 3136*b*-3 may be disposed parallel to the second sub-shielding member 3136*b*-2. The third sub-shielding member 3136*b*-3 may separate the first deposition source 3110*a* from the second deposition source 3110*b* and the first patterning slit sheet 3130*a* from the second patterning slit sheet 3130*b*. For example, the third sub-shielding member 3136*b*-3 may form at least two separate spaces, as the second sub-shielding member 3136*b*-2, and one deposition source and one patterning slit sheet may be disposed in each space. In each space, the first upper shielding member 3136*a*-1 and the second upper shielding member 3136*a*-2 may be respectively disposed side by side with the first patterning slit sheet 3130*a* and the second patterning slit sheet 3130*b*.

Figure 13:
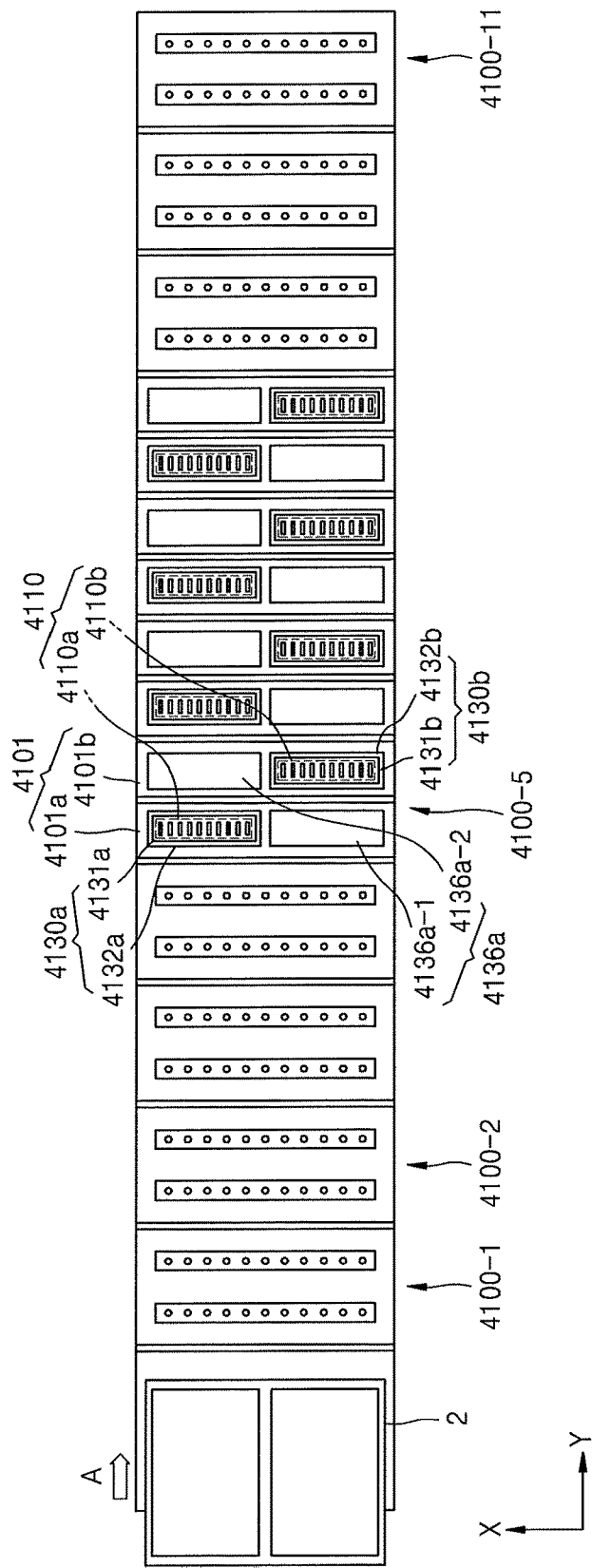
FIG. 13 illustrates a conceptual view of an arrangement of deposition sources and patterning slit sheets included in an organic layer deposition apparatus according to an embodiment.

According to an embodiment, as shown in FIG. 13, the organic layer deposition apparatus may further include a connection member 3137. The connection member 3137 may include at least one of a first connection member 3137*a* connecting the first deposition source 3110*a* to the first patterning slit sheet 3130*a*, and a second connection member 3137*b* connecting the second deposition source 3110*b* to the second patterning slit sheet 3130*b*.

The first connection member 3137*a* and the second connection member 3137*b* may be the same as or similar to the connection member 137 described above with reference to FIGS. 1-5, and a detailed description thereof is omitted herein. For example, when the connection member 3137 is provided, the first shielding member 3136*a* may be included or not included. For convenience of description, an embodiment in which the connection member 3137 is not included and the first shielding member 3136*a* is included will now be described in detail.

The organic layer deposition apparatus may deposit a deposition material while moving the substrate 2 over the first deposition source 3110*a* and the second deposition source 3110*b*. A deposition material emitted from the first deposition source 3110*a* may pass through the first pattern sheet 3131*a* and be deposited on a region of the substrate 2. The third sub-shielding member 3136*b*-3 and the second sub-shielding member 3136*b*-2 may prevent deposition of the deposition material emitted from the first deposition source 3110*a* on the other region of the substrate 2. The third sub-shielding member 3136*b*-3, the second sub-shielding member 3136*b*-2, and the second sub-shielding member 3136*b*-2 may prevent deposition of the deposition material emitted from the second deposition source 3110*b* on the other region of the substrate 2.

In the organic layer deposition apparatus and a method of manufacturing an organic light-emitting display apparatus by using the organic layer deposition apparatus, a plurality of pattern sheets 3131*a* and 3131*b* are used, and deformation or sagging of each pattern sheet 3131*a* or 3131*b* may be minimized. In the organic layer deposition apparatus and the method of manufacturing an organic light-emitting display apparatus by using the organic layer deposition apparatus, deposition may be performed on the entire area of the substrate 2 even when the size of the substrate 2 increases, and productivity may be improved. Due to, for example, the minimization of deformation or sagging of each pattern sheet 3131*a* or 3131*b*, a precise organic layer may be formed.

Figure 14:
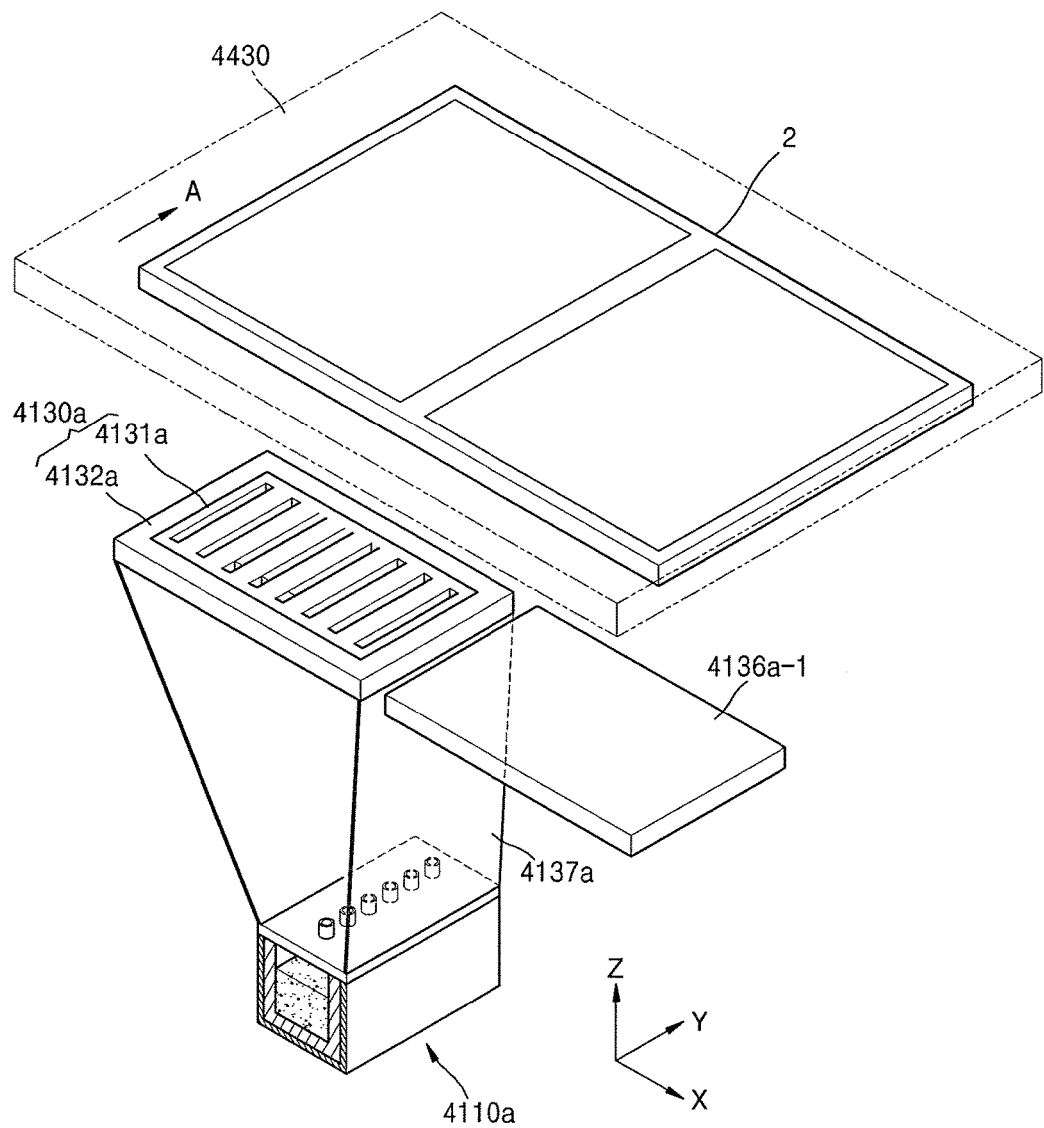
FIG. 14 illustrates a schematic perspective view of a part of a modification of a deposition assembly included in the organic layer deposition apparatus shown in FIG. 13.

FIG. 13 illustrates a conceptual view of an arrangement of deposition sources and patterning slit sheets of an organic layer deposition apparatus according to an embodiment. FIG. 14 illustrates a schematic perspective view of a part of a modification of a deposition assembly of the organic layer deposition apparatus shown in FIG. 13.

Referring to FIGS. 13 and 14, the organic layer deposition apparatus may be similar to the organic layer deposition apparatus 1 of FIG. 1. Components of the organic layer deposition apparatus that are different from those of the organic layer deposition apparatus 1 of FIG. 1 will now be focused in detail.

The organic layer deposition apparatus may include a plurality of chambers 4101. Each deposition assembly may be disposed on each chamber 4101, and deposition assemblies disposed within the plurality of chambers 4101 may be separated from one another. The plurality of chambers 4101 may be lined up and connected to one another. An opening may be formed between the plurality of chambers 4101, and a device opening or closing the opening, such as, a gate valve, may be mounted on the opening. A conveyer unit 4430 may pass through each chamber 4101 via the opening.

A fifth deposition assembly 4100-5 of the organic layer deposition apparatus may include a chamber 4101, a deposition source 4110, and a patterning slit sheet.

The chamber 4101 may include a first chamber 4101*a* and a second chamber 4101*b* disposed adjacent to each other and connected to each other. The first chamber 4101*a* and the second chamber 4101*b* may form independent spaces.

The deposition source 4110 may include a first deposition source 4110*a* and a second deposition source 4110*b*. The first deposition source 4110*a* and the second deposition source 4110*b* may be the same as or similar to the deposition source 110 described above with reference to FIGS. 1-5, and a detailed description thereof is omitted herein.

The patterning slit sheet may include a first patterning slit sheet 4130*a* and a second patterning slit sheet 4130*b*. The first patterning slit sheet 4130*a* may include a first pattern sheet 4131*a* and a first frame 4132*a*, and the second patterning slit sheet 4130*b* may include a second pattern sheet 4131*b* and a second frame 4132*b*. According to an embodiment, the first frame 4132*a* and the second frame 4132*b* may include a first shielding unit and a second shielding unit in a same or similar manner as or to that described above with reference to FIGS. 1-5. The first patterning slit sheet 4130*a* and the second patterning slit sheet 4130*b* may be the same as or similar to the first and second patterning slit sheets 1130*a* and 1130*b* described above with reference to FIGS. 7 and 8, and a detailed description thereof is omitted herein. For convenience of description, an embodiment in which the first frame 4132*a* and the second frame 4132*b* respectively do not include the first and second shielding units now be described in detail.

The first deposition source 4110*a* and the second deposition source 4110*b* may be respectively disposed within the first chamber 4101*a* and the second chamber 4101*b*. The first patterning slit sheet 4130*a* and the second patterning slit sheet 4130*b* may be respectively disposed within the first chamber 4101*a* and the second chamber 4101*b*.

A shielding member may include a first shielding member 4136*a*. The first shielding members 4136*a* may include a first upper shielding member 4136*a*-1 and a second upper shielding member 4136*a*-2. The first upper shielding member 4136*a*-1 may be disposed side by side with the first pattern sheet 4131*a* in a lengthwise direction of the first pattern sheet 4131*a*, and the second upper shielding member 4136*a*-2 may be disposed side by side with the second pattern sheet 4131*b* in a lengthwise direction of the second pattern sheet 4131*b*.

The shielding member may further include a second shielding member in addition to the first shielding member 4136*a*. For example, the second shielding member may include a second sub-shielding member and a third sub-shielding member, and the second sub-shielding member and the third sub-shielding member may be respectively provided on inner surfaces of the first chamber 4101*a* and the second chamber 4101*b*. For convenience of description, an embodiment in which the shielding member does not include the second shielding member will now be described in detail.

The organic layer deposition apparatus may sequentially form different organic layers on the substrate 2. Each deposition assembly may form one organic layer. For convenience of explanation, an embodiment in which the fifth deposition assembly 400-5 forming a pattern layer forms an organic layer will now be described in detail.

When the substrate 2 is conveyed into the first chamber 4101*a*, a deposition material may be vaporized or sublimated by the first deposition source 4110*a* and deposited on the substrate 2 via the first pattern sheet 4131*a*. When the substrate 2 somewhat proceeds, a deposition material may be vaporized or sublimated by the second deposition source 4110*b* and deposited on the substrate 2 via the second pattern sheet 4131*b*. An opening between the first chamber 4101*a* and the second chamber 4101*b* may be opened, and the first chamber 4101*a* and the second chamber 4101*b* may communicate with each other.

The first chamber 4101*a* and the second chamber 4101*b* may prevent deposition materials emitted from the first deposition source 4110*a* and the second deposition source 4110*b* from being leaked to the outside. The first upper shielding member 4136*a*-1 may prevent deposition of the deposition material emitted from the first deposition source 4110*a* on an area of the substrate 2 over the first pattern sheet 4131*a*, and the second upper shielding member 4136*a*-2 may prevent deposition of the deposition material emitted from the second deposition source 4110*b* on an area of the substrate 2 over the second pattern sheet 4131*b*.

In the organic layer deposition apparatus and a method of manufacturing an organic light-emitting display apparatus by using the organic layer deposition apparatus, a plurality of pattern sheets 4131*a* and 4131*b* are used, and deformation or sagging of each pattern sheet 4131*a* or 4131*b* may be minimized. In the organic layer deposition apparatus and the method of manufacturing an organic light-emitting display apparatus by using the organic layer deposition apparatus, deposition may be performed on the entire area of the substrate 2 even when the size of the substrate 2 increases, and productivity may be improved. Due to, for example, the minimization of deformation or sagging of each pattern sheet 4131*a* or 4131*b*, a precise organic layer may be formed.

By way of summation and review, organic light-emitting display apparatuses may include intermediate layers (including an emission layer) disposed between a first electrode and a second electrode that face each other. The first and second electrodes and the intermediate layers may be formed using various methods, one of which is an independent deposition method. When an organic light-emitting display apparatus is manufactured using the deposition method, a FMM, having the same/similar pattern as/to that of, for example, an intermediate layer to be formed, may be disposed to closely contact a substrate on which, for example, the intermediate layer, may be formed, and materials of, for example, the intermediate layer, may deposited over the FMM and may form, for example, an intermediate layer, having desired patterns.

However, such a deposition method using an FMM may not be suitable for manufacturing large organic light-emitting display apparatuses using a large mother glass. When a large mask is used, the mask may bend due to, for example, its own weight, and a distorted pattern may be obtained. However, this may not be conducive for the recent trend towards high-definition patterns.

Moreover, the processes of aligning a substrate and an FMM to closely contact each other, performing deposition thereon, and separating the FMM from the substrate may be time-consuming, and may result in a long manufacturing time and low production efficiency.

Organic light-emitting display apparatuses according to embodiments may realize a high-density image quality. Organic layer deposition apparatuses and a method of manufacturing an organic light-emitting display apparatus by using the organic layer deposition apparatuses may improve production efficiency.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display apparatus by using an organic layer deposition apparatus for forming an organic layer on a substrate, the method comprising:

fixing the substrate to a moving unit, the fixing being performed by a loading unit;

conveying the moving unit to which the substrate has been fixed into a chamber by using a first conveyer unit mounted to pass through the chamber, the substrate being conveyed with the moving unit in a first direction;

forming the organic layer by depositing a deposition material discharged from a deposition assembly within the chamber on different regions of the substrate via a plurality of pattern sheets spaced apart from each other while the substrate is moving relative to the deposition assembly with the substrate separated from the deposition assembly;

separating a deposition-completed substrate from the moving unit, the separating being performed by an unloading unit; and transferring the moving unit separated from the substrate to the loading unit by using a second conveyer unit mounted to pass through the chamber, wherein the plurality of pattern sheets include first and second pattern sheets in a frame, the first pattern sheet including first slits, the second pattern sheet including second slits, and wherein:

the first slits of the first pattern sheet do not overlap the second slits of the second pattern sheet in the first direction, and the first slits of the first pattern sheet do not overlap the second slits of the second pattern sheet in the first direction and a second direction perpendicular to the first direction, wherein the frame is divided into at least four portions by at least an axis passing through a center of the frame, each of the four portions having in a same shape, and wherein:

the first slits of the first pattern sheet and the second slits of the second pattern sheet are arranged in two portions of the at least four portions, respectively, and other portions of the at least four portions do not have any slits.

2. The method as claimed in claim 1, wherein the different regions of the substrate include first and second regions arranged in the second direction.

3. The method as claimed in claim 2, wherein while the deposition material is being deposited on the first region through the first slits of the first pattern sheet, the deposition material is not deposited on the second region, and while the deposition material is being deposited on the second region through the second slits of the second pattern sheet, the deposition material is not deposited on the first region.

4. The method as claimed in claim 2, wherein the plurality of pattern sheets zigzag with respect to a straight line parallel to a direction in which the deposition material is deposited.

5. The method as claimed in claim 2, wherein:

the deposition assembly includes a deposition source which emits the deposition material to the outside, and the deposition source is between adjacent pattern sheets from among the plurality of pattern sheets.

6. The method as claimed in claim 2, wherein:

the deposition assembly includes a plurality of deposition sources which emit the deposition material to the outside, and each of the plurality of deposition sources corresponds to each of the plurality of pattern sheets.

7. The method as claimed in claim 2, wherein the plurality of pattern sheets is arranged on a same plane.

8. The method as claimed in claim 2, wherein a portion of the deposition material is blocked by a first shielding member adjacent to the second pattern sheet in the first direction and adjacent to the first pattern sheet in the second direction perpendicular to the first direction.

9. The method as claimed in claim 2, wherein:

the chamber includes a plurality of the deposition assemblies, and at least certain ones of the plurality of the deposition assemblies are within different spaces.

10. The method as claimed in claim 2, wherein:

the chamber includes a plurality of the deposition assemblies, and the plurality of the deposition assemblies forms different organic layers.

11. The method as claimed in claim 2, wherein the organic layer is formed with each of the plurality of pattern sheets separated from one another by a second shielding member.

* * * * *